(12) United States Patent
Lee et al.

(10) Patent No.: US 9,047,966 B2
(45) Date of Patent: Jun. 2, 2015

(54) ARCHITECTURE OF MAGNETO-RESISTIVE MEMORY DEVICE

(71) Applicant: Samsung Electronics Co., Ltd., Suwon-si (KR)

(72) Inventors: Jae-Young Lee, Hwaseong-si (KR); Bong-Jin Kang, Yongin-si (KR); Jung-Hwa Hwang, Suwon-si (KR); Ki-Woong Yeom, Hwaseong-si (KR); Young-Kwan Kim, Busan (KR); Dong-Hyun Shon, Hwaseong-si (KR)

(73) Assignee: SAMSUNG ELECTRONICS CO., LTD., Samsung-ro, Yeongtong-gu, Suwon-si Gyeonggi-do (KR)

( * ) Notice: Subject to any disclaimer, the term of this patent is extended or adjusted under 35 U.S.C. 154(b) by 155 days.

(21) Appl. No.: 13/931,275

(22) Filed: Jun. 28, 2013

(65) Prior Publication Data

US 2014/0050020 A1 Feb. 20, 2014

(30) Foreign Application Priority Data

Aug. 17, 2012 (KR) .......................... 10-2012-0090299

(51) Int. Cl.
*G11C 7/00* (2006.01)
*G11C 11/16* (2006.01)
*G11C 7/10* (2006.01)

(52) U.S. Cl.
CPC ........ *G11C 11/1653* (2013.01); *G11C 11/1655* (2013.01); *G11C 11/1657* (2013.01); *G11C 11/1673* (2013.01); *G11C 7/1054* (2013.01); *G11C 7/1081* (2013.01)

(58) Field of Classification Search
USPC .......... 365/158, 230.06, 189.15, 205, 206, 63
See application file for complete search history.

(56) References Cited

U.S. PATENT DOCUMENTS

| | | | | |
|---|---|---|---|---|
| 5,774,409 A | * | 6/1998 | Yamazaki et al. | ....... 365/230.03 |
| 6,141,269 A | * | 10/2000 | Shiomi et al. | ................. 365/200 |
| 6,256,227 B1 | | 7/2001 | Atsumi et al. | |
| 6,490,217 B1 | | 12/2002 | DeBrosse et al. | |
| 6,627,937 B2 | | 9/2003 | Shinkawata | |
| 7,123,531 B2 | | 10/2006 | Rho | |
| 7,283,384 B1 | | 10/2007 | Jenne et al. | |
| 7,596,044 B2 | | 9/2009 | Han | |
| 7,692,991 B2 | | 4/2010 | Koshita | |
| 7,787,290 B2 | | 8/2010 | Takemura et al. | |
| 7,869,239 B2 | | 1/2011 | Min et al. | |

(Continued)

FOREIGN PATENT DOCUMENTS

| | | |
|---|---|---|
| JP | 10-199262 | 7/1998 |
| KR | 10-1024148 | 4/2006 |
| KR | 10-0855572 B1 | 8/2008 |

*Primary Examiner* — Son Dinh
(74) *Attorney, Agent, or Firm* — Muir Patent Law, PLLC

(57) ABSTRACT

Provided is a semiconductor memory device including a column decoder, a plurality of sub-cell blocks, and a bit line selection circuit. The column decoder is configured to decode column addresses and drive column selection signals. Each of the sub-cell blocks includes a plurality of bit lines, a plurality of word lines, and a plurality of memory cells connected to the plurality of bit lines and the plurality of word lines. The bit line selection circuit includes a plurality of bit line connection controllers, and is configured to select one or more bit lines in response to the column selection signals. Each of the bit line connection controllers electrically couples a respective first bit line to corresponding first and second local input/output (I/O) lines in response to first and second column selection signals of the column selection signals, respectively.

31 Claims, 25 Drawing Sheets

(56) References Cited

U.S. PATENT DOCUMENTS

| | | |
|---|---|---|
| 8,310,853 B2 | 11/2012 | Min et al. |
| 2004/0160251 A1 | 8/2004 | Lin et al. |
| 2005/0276100 A1 | 12/2005 | Yang et al. |
| 2007/0076500 A1 | 4/2007 | Im et al. |
| 2010/0014342 A1 | 1/2010 | Hoya et al. |
| 2010/0034015 A1 | 2/2010 | Tsuji |
| 2010/0320570 A1 | 12/2010 | Nakamura et al. |
| 2011/0103168 A1 | 5/2011 | Yang et al. |
| 2011/1014020 | 6/2011 | Park et al. |
| 2011/0254097 A1 | 10/2011 | Noguchi et al. |

\* cited by examiner

ARCHITECTURE OF MAGNETO-RESISTIVE MEMORY DEVICE

CROSS-REFERENCE TO RELATED APPLICATION

This application claims priority under 35 U.S.C. §119 to Korean Patent Application No. 10-2012-0090299 filed on Aug. 17, 2012, the disclosure of which is hereby incorporated by reference in its entirety.

BACKGROUND

Various example embodiments relate to a memory device, and more particularly, to a magneto-resistive memory device including spin transfer torque-magneto-resistive random access memory (STT-MRAM) cells.

With a reduction in the volumes of semiconductor products, there is a growing need to increase the amount of data processing of the semiconductor products. Thus, it may desirable to increase the operating speed and integration density of memory devices used for the semiconductor products. To meet these demands, for example, a magneto-resistive random access memory (MRAM) configured to serve a memory function using a variation in resistance with the polarity of a magnetic body, has been proposed.

Recently, research has been conducted into methods of embodying semiconductor memory devices optimized for high-speed low-power mobile devices including MRAM cells.

SUMMARY

The present disclosure provides an architecture of a magneto-resistive random access memory device (MRAM), which may optimize operating characteristics of the MRAM and increase the integration density of elements of the MRAM.

In accordance with one embodiment, a semiconductor memory device includes a row decoder, a column decoder, a plurality of sub-cell blocks, a plurality of bit line sense amplifier regions, a plurality of sub-word line drivers, and bit line connection controllers. The row decoder is configured to decode row addresses and drive global word line driving signals. The column decoder is configured to decode column addresses and drive column selection signals to select a specific bit line. Each of the plurality of sub-cell blocks includes a plurality of bit lines, a plurality of word lines, and a plurality of memory cells connected to the plurality of bit lines and the plurality of word lines. Each of the bit line sense amplifier regions includes bit line sense amplifiers and is disposed between two sub-cell blocks in a first direction, and each of the bit line sense amplifiers is configured to sense and amplify data of a corresponding bit line. Each of the sub-word line drivers is disposed between two sub-cell blocks in a second direction perpendicular to the first direction and is configured to drive corresponding word lines in response to the global word line driving signals. Each of the bit line connection controllers electrically couples a respective first bit line to corresponding first and second local input/output (I/O) lines in response to first and second column selection signals of the column selection signals, respectively.

In accordance with another embodiment, a semiconductor memory device includes a plurality of cell blocks, a row decoder, a column decoder, a plurality of bit line sense amplifier regions. Each of the cell blocks includes a plurality of memory cells connected to a plurality of bit lines extending in a first direction and a plurality of word lines extending in a second direction perpendicular to the first direction. The row decoder is configured to decode row addresses and drive word line driving signals on the word lines. The column decoder is configured to decode column addresses and drive column selection signals on column selection lines. Each of the bit line sense amplifier regions includes bit line sense amplifiers disposed between the cell blocks in the first direction. A first bit line sense amplifier region of the bit line sense amplifier regions includes a first P region and a first N region. The first P region includes a plurality of PMOS transistors disposed in the first direction. The first N region includes a plurality of NMOS transistors disposed in the first direction and spaced apart from the first P region in the second direction.

In accordance with further another embodiment, a semiconductor memory device includes a memory cell region in a first well, a row decoder, a column decoder, a sub-word line driver, a bit line sense amplifier, and second and third wells. The memory cell region includes a plurality of memory cells connected to a plurality of word lines and a plurality of bit lines, wherein the memory cells are formed in the first well that is a first-type well. The row decoder is configured to decode row addresses and output global word line driving signals. The column decoder is configured to decode column addresses and output column selection signals. The row decoder and column decoder are disposed in a peripheral circuit region. The sub-word line driver is configured to output respective word line driving signals in response to the global word line driving signals. The bit line sense amplifier includes a plurality of PMOS and NMOS transistors. The sub-word line driver and bit line sense amplifier are disposed in a core circuit region. The second well that is a second-type well different from the first-type well, and is disposed adjacent to a first side of the first well. The third well that is the second-type well, and is disposed adjacent to a second side of the first well opposite to the first side. The first well includes a first well bias region connected to a first voltage terminal. Each of the second and third wells includes second and third bias regions connected to second and third voltage terminals, respectively. The first voltage terminal is configured to receive a first voltage level different from that received by each of the second and third voltage terminals. The first through third wells are disposed on a fourth well that is the second-type well.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
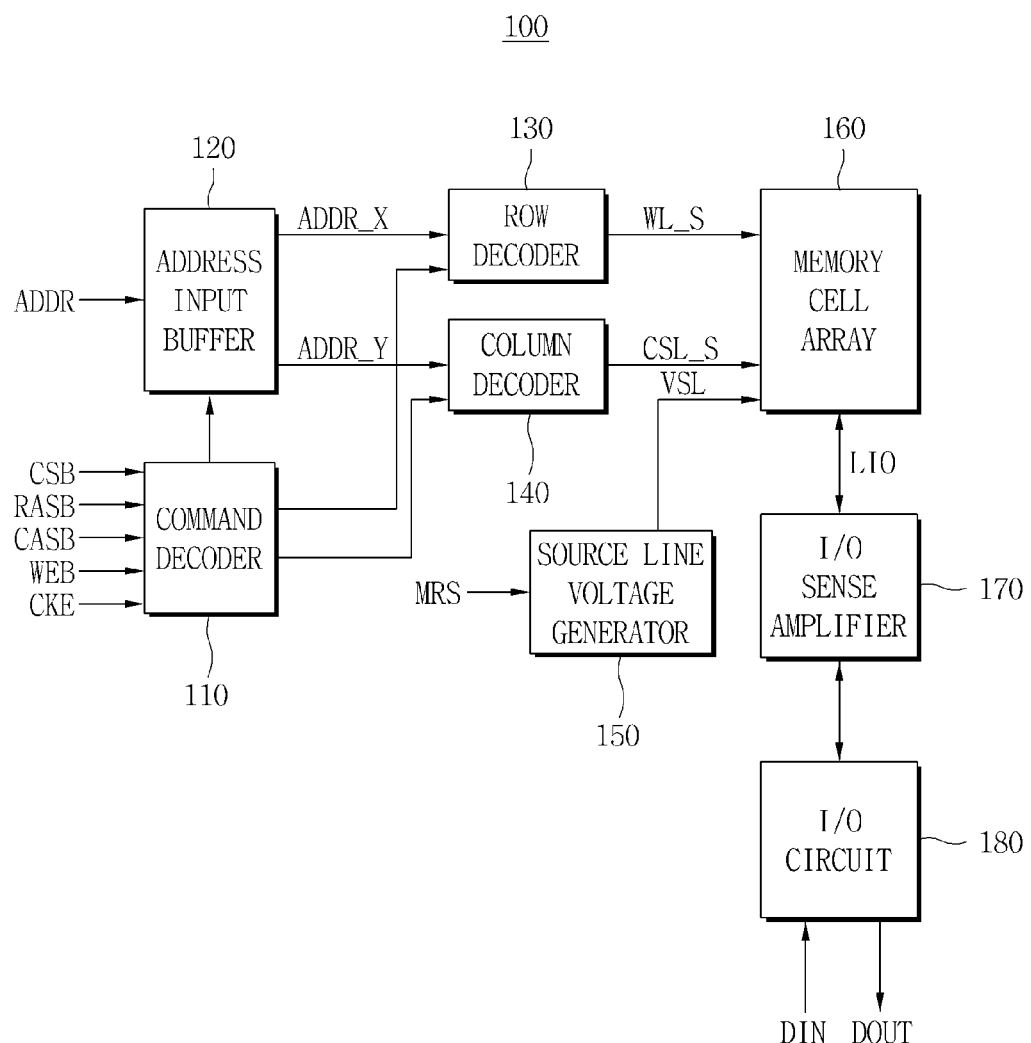
FIG. 1 is a block diagram of a magneto-resistive memory device according to some embodiments.

Example embodiments of the present disclosure will now be described more fully with reference to the accompanying drawings, in which exemplary embodiments of the disclosure are shown. This disclosure may, however, be embodied in many alternate forms and should not be construed as limited to the embodiments set forth herein.

Accordingly, while the disclosure can be modified in various ways and take on various alternative forms, specific embodiments thereof are shown in the drawings and described in detail below as examples. There is no intent to limit the disclosure to the particular forms disclosed. On the contrary, the disclosure is to cover all modifications, equivalents, and alternatives falling within the spirit and scope of the appended claims. Elements of the example embodiments are consistently denoted by the same reference numerals throughout the drawings and detailed description.

It will be understood that, although the terms first, second, etc. may be used herein in reference to elements of the disclosure, unless indicated otherwise, such elements should not be construed as limited by these terms. For example, a first element could be termed a second element, and a second element could be termed a first element, without departing from the scope of the present disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments is not intended to limit the scope of the disclosure. The articles "a," "an," and "the" are singular in that they have a single referent, however the use of the singular form in the present document should not preclude the presence of more than one referent. In other words, elements of the disclosure referred to in the singular may number one or more, unless the context clearly indicates otherwise. It will be further understood that the terms such as "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this disclosure belongs. It will be further understood that terms in common usage should also be interpreted as is customary in the relevant art and not in an idealized or overly formal sense unless expressly so defined herein.

It should also be noted that in some alternative implementations, operations may be performed out of the sequences depicted in the flowcharts. For example, two operations shown in the drawings to be performed in succession may in fact be executed substantially concurrently or even in reverse of the order shown, depending upon the functionality/acts involved.

The disclosure will now be described more fully with reference to the accompanying drawings, in which embodiments are shown.

FIG. 1 is a block diagram of a magneto-resistive memory device 100 according to some embodiments.

Referring to FIG. 1, the magneto-resistive memory device 100 may include a command decoder 110, an address input buffer 120, a row decoder 130, a column decoder 140, a source line voltage generator 150, a memory cell array 160, an input/output (I/O) sense amplifier 170, and an I/O circuit 180.

The command decoder 110 may decode a chip selection signal CSB, a row address strobe signal RASB, a column address strobe signal CASB, a write enable signal WEB, and a clock enable signal CKE, generate a plurality of control signals, and control circuits disposed in the magneto-resistive memory device 100.

The memory cell array 160 may include, for example, a plurality of spin transfer torque-magneto-resistive random access memory (STT-MRAM) cells, and operate in response to word line drive signals WL_s and column selection signals CSL_s.

The address input buffer 120 may generate row addresses ADDR_X and column addresses ADDR_Y based on external addresses ADDR.

The row decoder 130 may decode the row addresses ADDR_X, generate the decoded row addresses, and generate the word line drive signals WL_s based on the decoded row addresses.

The column decoder 140 may decode the column addresses ADDR_Y, generate the decoded column addresses, and generate the column selection signals CSL_s based on the decoded column addresses.

The source line voltage generator 150 may generate a source line drive voltage VSL in response to an external power supply voltage, and provide the source line drive voltage VSL to the source line of the memory cell array 160. The source line voltage generator 150 may disable some or all of circuits constituting the source line voltage generator 150 in a standby mode or a power-down mode. Also, the source line voltage generator 150 may disable some or all of the circuits constituting the source line voltage generator 150 in response to a mode register set (MRS) signal.

The I/O sense amplifier 170 may amplify data output from the memory cell array 160 through a local I/O line LIO, output first data, and transmit input data DIN through the local I/O line LIO to the memory cell array 160.

The I/O circuit 180 may determine the order of output of the first data, perform a parallel-to-serial conversion operation, generate output data DOUT, buffer the input data DIN, and provide the buffered input data DIN to the I/O sense amplifier 170.

Figure 2:
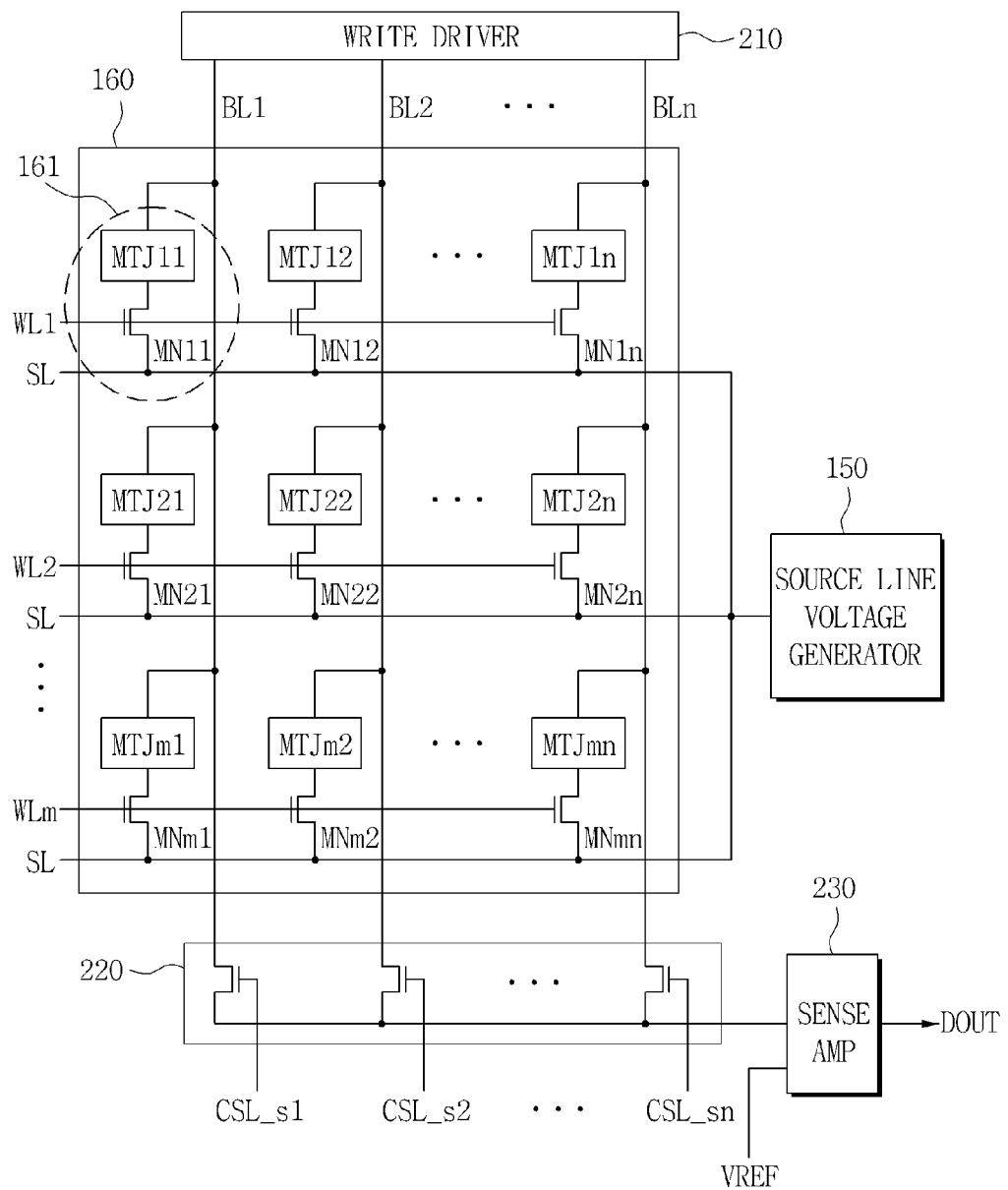
FIG. 2 is a circuit diagram of an example of a memory cell array included in the magneto-resistive memory device of FIG. 1 according to some embodiments.

FIG. 2 is a circuit diagram of an example of the memory cell array 160 included in the magneto-resistive memory device of FIG. 1 according to some embodiments.

Referring to FIG. 2, the memory cell array 160 may be connected to a write driver 210, a bit line selection circuit 220, a source line voltage generator 150, and a sense amplifier 230.

The memory cell array 160 may include a plurality of word lines WL1 to WLm and a plurality of bit lines BL1 to BLn, and memory cells 161 may be interposed between the word lines WL1 to WLm and the bit lines BL1 to BLn, respectively.

The memory cell array 160 may include memory cell transistors MN11 to MNmn having gates connected to the word lines WL1 to WLm, respectively, and MTJ elements MTJ11 to MTJmn connected between the memory cell transistors MN11 to MNmn and the bit lines BL1 to BLn, respectively. Sources of the respective memory cell transistors MN11 to MN1n may be connected to source lines SL.

The bit line selection circuit 220 may selectively connect the bit lines BL1 to BLn to the sense amplifier 230 in response to column selection signals CSL_s1 to CSL_sn.

The sense amplifier 230 may amplify a difference between an output voltage signal of the bit line selection circuit 220 and a reference voltage VREF, and generate output data DOUT.

The write driver 210 may be connected to the bit lines BL1 to BLn, generate a program current based on write data, and provide the program current to the bit lines BL1 to BLn. To magnetize the MTJ elements included in the memory cell array 160, a voltage higher than a voltage applied to the bit lines BL1 to BLn may be applied to the source lines SL. The source line voltage generator 150 may generate a source line driving voltage VSL and provide the source line driving voltage VSL to the source lines SL of the memory cell array 160.

Figure 3:
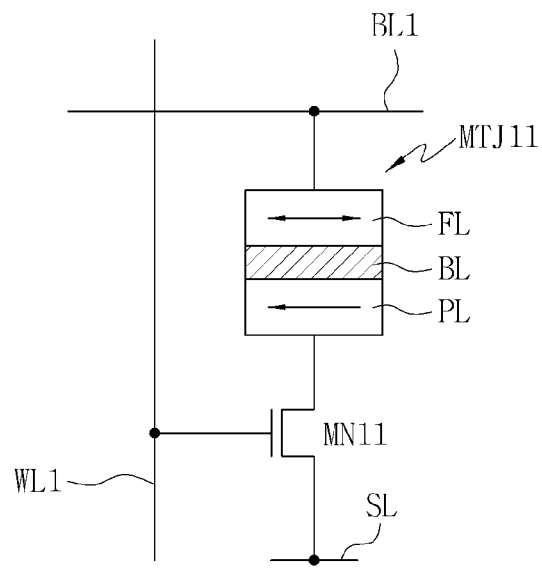
FIG. 3 is a circuit diagram of an example of a magneto-resistive memory cell constituting the memory cell array of FIG. 2 according to one embodiment.

FIG. 3 is a circuit diagram of an example of a magneto-resistive memory cell constituting the memory cell array 160 of FIG. 2 according to one embodiment.

Referring to FIG. 3, the magneto-resistive memory cell 161 may include a memory cell transistor MN11 including an NMOS transistor and an MTJ element MTJ11. The memory cell transistor MN11 may include a gate connected to the word line WL1 and a source connected to the source line SL. The MTJ element MTJ11 may be connected between a drain of the memory cell transistor MN11 and the bit line BL1.

Figure 4:
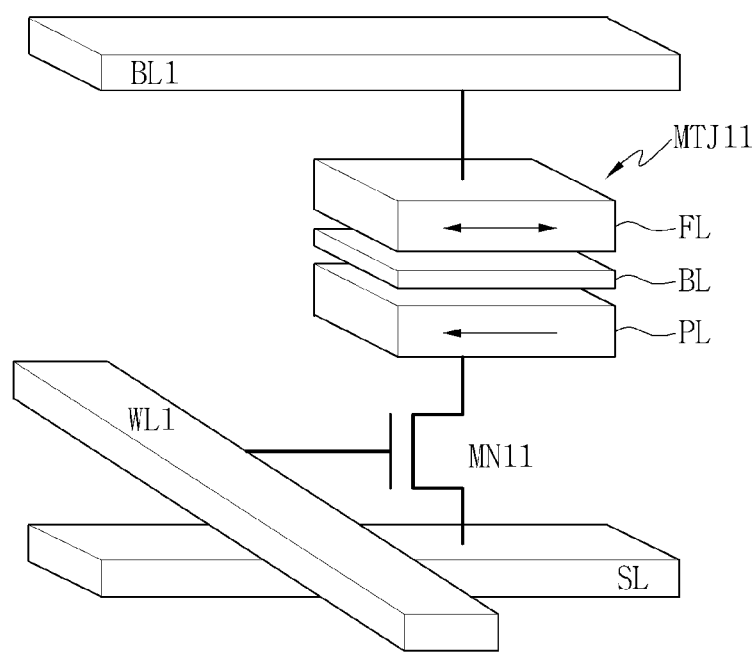
FIG. 4 is a 3-dimensional diagram of the magneto-resistive memory cell of FIG. 3 according to one embodiment.

FIG. 4 is a 3-dimensional diagram of the magneto-resistive memory cell of FIG. 3 according to one embodiment.

Referring to FIG. 4, the MTJ element MTJ11 may include a pinned layer PL having a predetermined pinned magnetization direction, a free layer FL magnetized in the direction of an externally applied magnetic field, and a tunnel barrier layer BL formed between the pinned layer PL and the free layer FL and including an insulating film. To pin a magnetization direction of the pinned layer PL, the MTJ element MTJ11 may further include an anti-ferromagnetic layer (not shown). The MTJ element MTJ11 of FIG. 4 may be an MTJ element constituting an STT-MRAM.

To enable a write operation of the STT-MRAM, a logic-high voltage may be applied to the word line WL1 to turn on the memory cell transistor MN11, and a write current may be applied between the bit line BL1 and the source line SL. To enable a read operation of the STT-MRAM, a logic-high voltage may be applied to the word line WL1 to turn on the memory cell transistor MN11, and a read current may be applied from the bit line BL1 toward the source line SL so that data stored in the memory cell can be determined based on the resistance of the MTJ element due to the applied read current.

Figure 5:
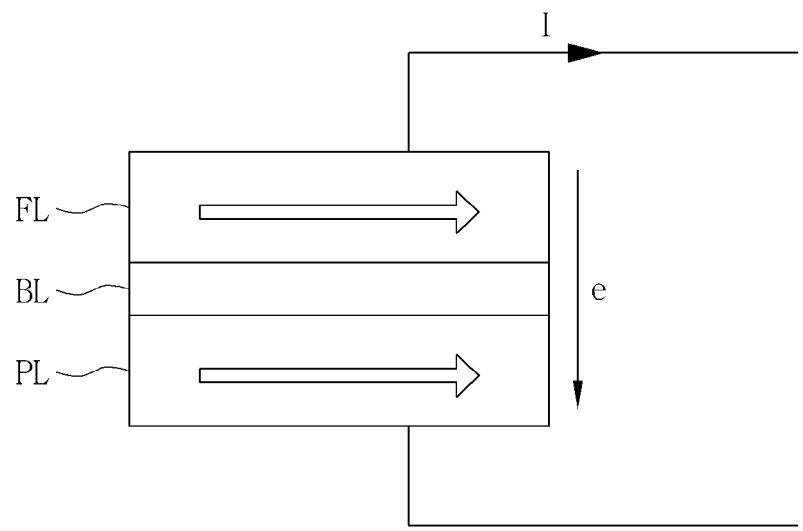
FIGS. 5 and 6 are diagrams showing magnetization directions of a magnetic tunnel junction (MTJ) element due to written data, according to some embodiments.
Figure 6:
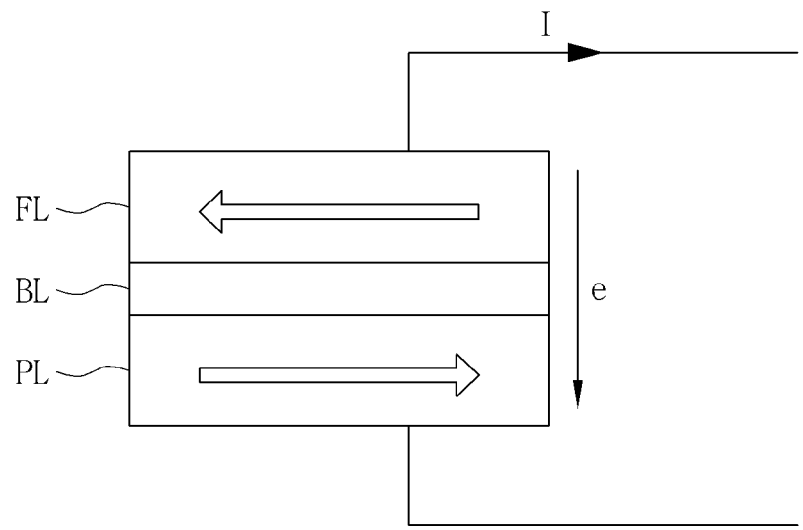

FIGS. 5 and 6 are diagrams of magnetization directions of an MTJ element due to written data, according to some embodiments.

The resistance of an MTJ element may change according to a magnetization direction of a free layer FL. When a read current I is supplied to the MTJ element, a data voltage may be output according to the resistance of the MTJ element. Since the read current I has a much lower intensity than a write current, the magnetization direction of the free layer FL may not change by the read current I.

Referring to FIG. 5, in the MTJ element, the magnetization direction of the free layer FL may be parallel to a magnetization direction of the pinned layer PL. In this case, the MTJ element may have a low resistance. Here, data '0' may be read.

Referring to FIG. 6, in the MTJ element, the magnetization direction of the free layer FL may be anti-parallel to the magnetization direction of the pinned layer PL. In this case, the MTJ element may have a high resistance. Here, data '1' may be read.

Although FIGS. 5 and 6 show an example in which the free layer FL and the pinned layer PL of the MTJ element are horizontal magnetic elements, in other embodiments, the free layer FL and the pinned layer PL may be vertical magnetic elements.

Figure 7:
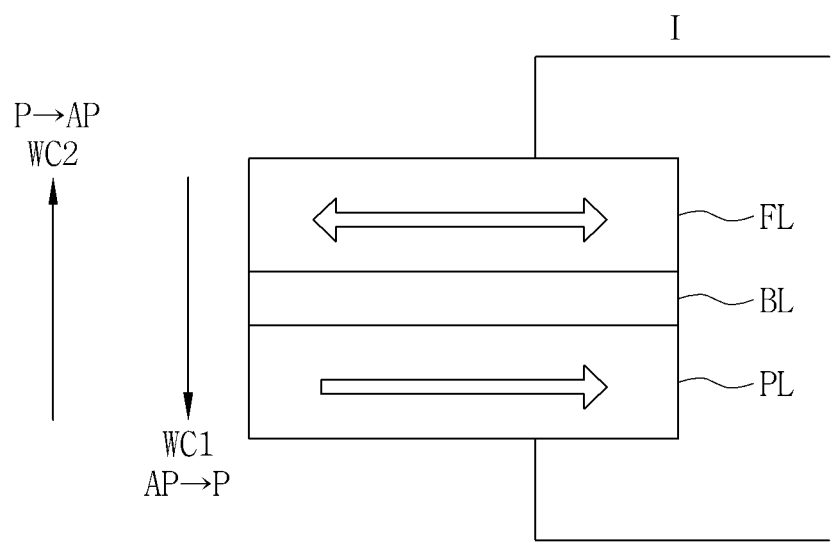
FIG. 7 is a diagram illustrating a write operation of an MTJ element according to one embodiment.

FIG. 7 is a diagram of a write operation of the MTJ element according to one embodiment.

Referring to FIG. 7, the magnetization direction of the free layer FL may be determined according to directions of write currents WC1 and WC2 flowing through the MTJ element. For example, when a first write current WC1 is applied, free electrons having the same spin direction as the pinned layer PL may apply torque to the free layer FL. As a result, the free layer FL may be magnetized parallel to the pinned layer PL. When a second write current WC2 is applied, electrons having an opposite spin direction to the pinned layer PL may return to the free layer FL and apply torque. As a result, the free layer FL may be magnetized anti-parallel to the pinned layer PL. For example, in the MTJ element, the magnetization direction of the free layer FL may be changed due to spin transfer torque (STT).

Figure 8:
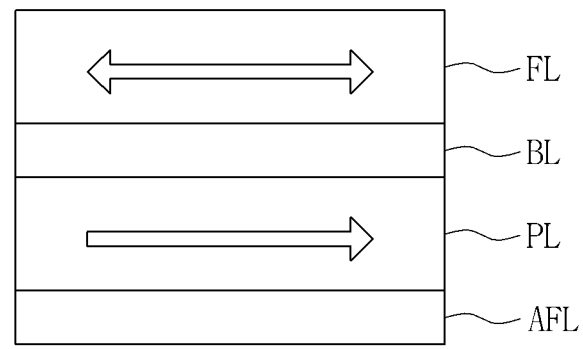
FIGS. 8 through 12 are diagrams of MTJ elements included in the memory cell array of FIG. 2, according to some embodiments.
Figure 9:
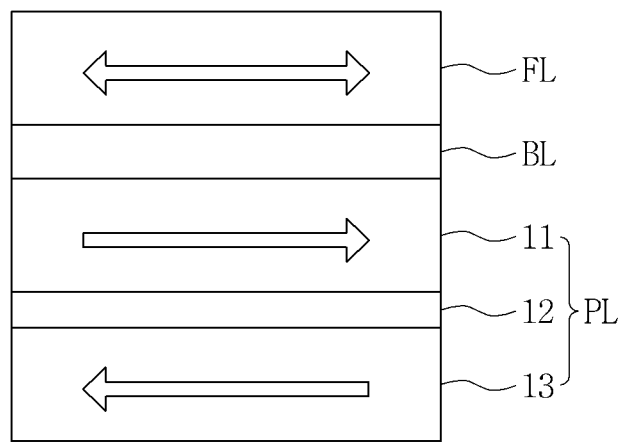

FIGS. 8 through 12 are diagrams of the MTJ element included in the memory cell array of FIG. 2, according to some embodiments FIGS. 8 and 9 are diagrams of an MTJ element having a horizontal magnetization direction in an STT-MRAM according to some embodiments. In the MTJ element having the horizontal magnetization direction, a direction in which current flows may be substantially vertical to a magnetization easy axis.

Referring to FIG. 8, the MTJ element may include a free layer FL, a tunnel barrier layer BL, a pinned layer PL, and an anti-ferromagnetic layer AFL.

The free layer FL may include a material having a variable magnetization direction. A magnetization direction of the free layer FL may be changed due to electrical/magnetic factors provided inside and/or outside the memory cell. The free layer FL may include a ferromagnetic material including at least one of cobalt (Co), iron (Fe), and nickel (Ni). For example, the free layer FL may include at least one selected from the group consisting of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The tunnel barrier layer BL may have a smaller thickness than a spin diffusion distance. The tunnel barrier layer BL may include a nonmagnetic material. In an example, the tunnel barrier layer BL may include at least one selected from the group consisting of magnesium (Mg), titanium (Ti), aluminum (Al), magnesium-zinc (MgZn), and a magnesium-boron (MgB) oxide, a titanium (Ti) nitride, and a vanadium (V) nitride.

The pinned layer PL may have a pinned magnetization direction due to the anti-ferromagnetic layer AFL. Also, the pinned layer PL may include a ferromagnetic material. For example, the pinned layer PL may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer AFL may include an anti-ferromagnetic material. For example, the anti-ferromagnetic layer AFL may include at least one selected from the group consisting of PtMn, IrMn, MnO, MnS, MnTe, $MnF_2$, $FeCl_2$, FeO, $CoCl_2$, CoO, $NiCl_2$, NiO, and Cr.

In another embodiment, since each of a free layer and a pinned layer of an MTJ element is formed of a ferromagnetic material, a stray field may be generated at an edge of the ferromagnetic material. The stray field may lower magnetic resistance or increase resistive magnetic force of the free layer, and affect switching characteristics to form asymmetric switching. Accordingly, a structure configured to reduce or control the stray field generated in the ferromagnetic material of the MTJ element may be required.

Referring to FIG. 9, the pinned layer PL of the MTJ element may include a synthetic anti-ferromagnetic (SAF) layer. The pinned layer PL may include a first ferromagnetic layer 11, a coupling layer 12, and a second ferromagnetic layer 13. Each of the first and second ferromagnetic layers 11 and 13 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. In this case, the first and second ferromagnetic layers 11 and 13 may have different magnetization directions, and the magnetization direction of each of the first and second ferromagnetic layers 11 and 13 may be pinned. The coupling layer 12 may include ruthenium (Ru).

Figure 10:
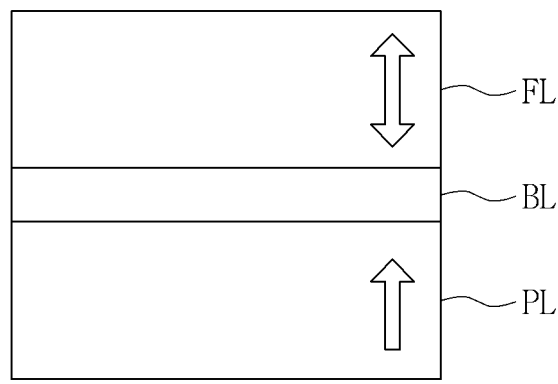

FIG. 10 is a diagram of an MTJ element included in an STT-MRAM, according to one embodiment. The MTJ element having a vertical magnetization direction may have a magnetization easy axis substantially parallel to a direction in which current moves. Referring to FIG. 10, the MTJ element may include a free layer FL, a pinned layer PL, and a tunnel barrier layer BL.

When a magnetization of the free layer FL is parallel to a magnetization direction of the pinned layer PL, resistance may become low, whereas when the magnetization of the free layer FL is anti-parallel to the magnetization direction of the pinned layer PL, resistance may become high. Data may be stored according to the resistance.

To embody the MTJ element having a vertical magnetization direction, the free layer FL and the pinned layer PL may be formed of a material having a high magnetic isotropic energy. Materials having high magnetic isotropic energies may include alloys of amorphous rare-earth elements, multi-layered thin films, such as (Co/Pt)n or (Fe/Pt)n, and ordered lattice materials having L10 crystalline structures. For example, the free layer FL may include an ordered alloy and include at least one selected from the group consisting of iron (Fe), cobalt (Co), nickel (Ni), palladium (Pa), and platinum (Pt). For instance, the free layer FL may include at least one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. For example, these alloys may be stoichiometrically expressed by $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$.

The pinned layer PL may include an ordered alloy and include at least one selected from the group consisting of Fe, Co, Ni, Pa, and Pt. For example, the pinned layer PL may include at least one selected from the group consisting of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. For example, these alloys may be stoichiometrically expressed by $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni2_{0}Pt_{50}$.

Figure 11:
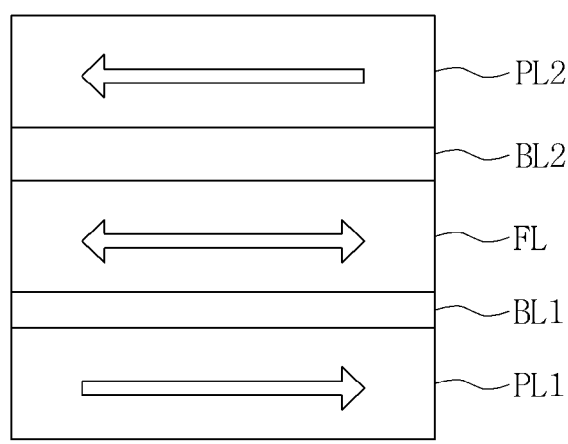
Figure 12:
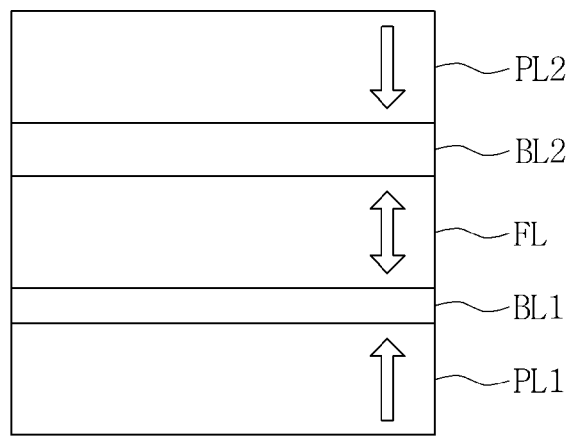

FIGS. 11 and 12 are diagrams of dual MTJ elements, which are MTJ elements included in STT-MRAM devices according to some embodiments. A dual MTJ element may have a structure in which a tunnel barrier layer and a pinned layer are respectively disposed at both ends of a free layer.

Referring to FIG. 11, a dual MTJ element forming a horizontal magnetic field may include a first pinned layer PL2, a first tunnel barrier layer BL2, a free layer FL, a second tunnel barrier layer BL1, and a second pinned layer PL1. Materials forming the respective layers may be equal or similar to those of the free layer FL, the tunnel barrier layer BL, and the pinned layer PL described above with reference to FIG. 8.

In this case, when the first pinned layer PL2 is fixed in an opposite magnetization direction to the second pinned layer PL1, magnetic forces caused by the first and second pinned layers PL2 and PL1 may substantially counterbalance each other. Accordingly, the dual MTJ element may perform a write operation using a smaller current than a typical MTJ element.

In addition, since the dual MTJ element provides a higher resistance during a read operation due to the second tunnel barrier layer BL1, a clearer data value may be obtained.

Referring to FIG. 12, a dual MTJ element forming a vertical magnetic field may include a first pinned layer PL2, a first tunnel barrier layer BL2, a free layer FL, a second tunnel barrier layer BL1, and a second pinned layer PL1. Materials forming the respective layers may be equal or similar to those of the free layer FL, the tunnel barrier layer BL, and the pinned layer PL described above with reference to FIG. 8.

In this case, when the first pinned layer PL2 is pinned in an opposite magnetization direction to the second pinned layer PL1, magnetic forces caused by the first and second pinned layers PL2 and PL1 may substantially counterbalance each other. Accordingly, the dual MTJ element may perform a write operation using a smaller current than a typical MTJ element.

Figure 13:
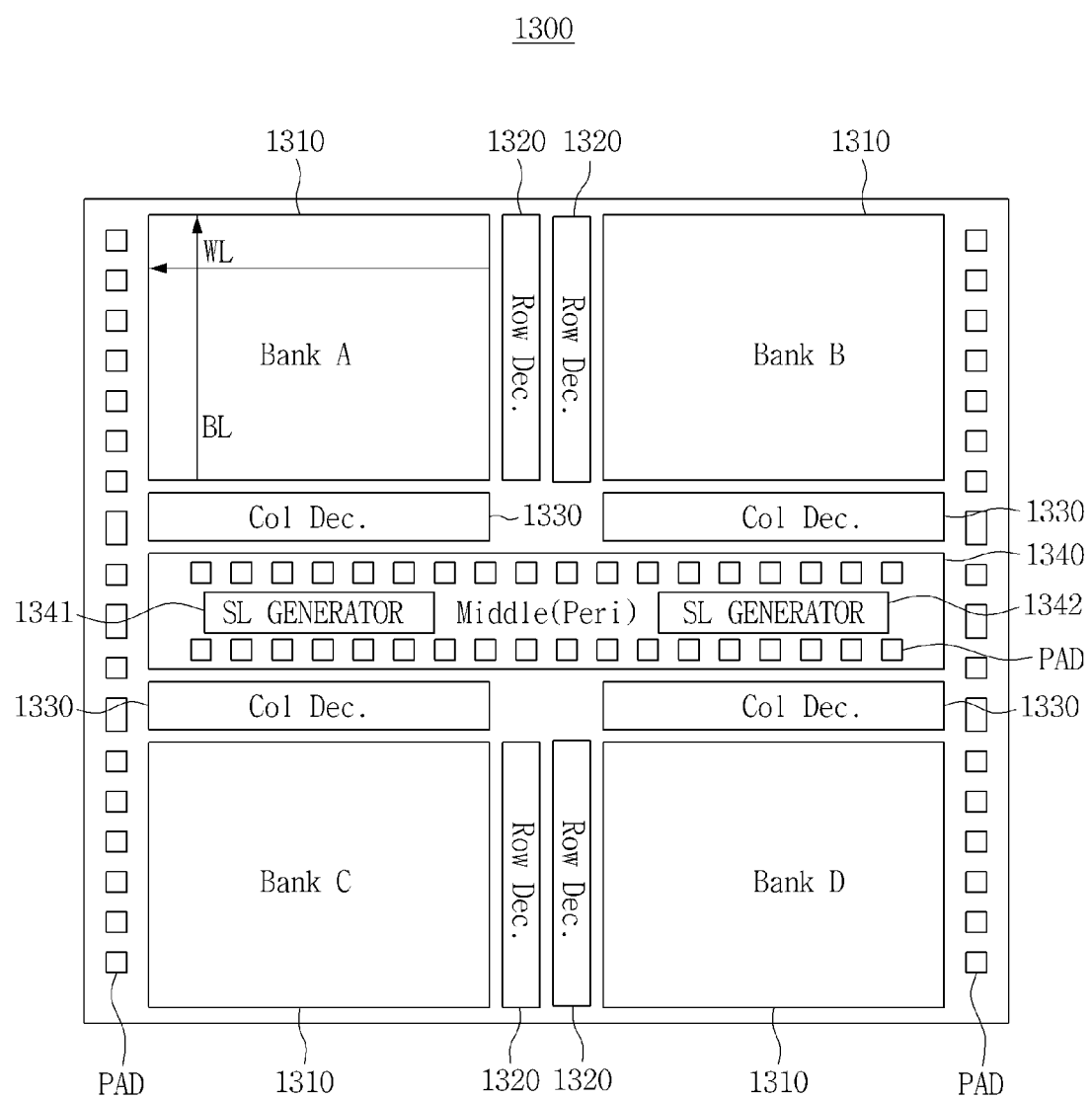
FIG. 13 illustrates an exemplary layout of a semiconductor memory chip constituting a magneto-resistive memory device according to some embodiments.

FIG. 13 illustrates an exemplary layout of a semiconductor memory chip 1300 constituting a magneto-resistive memory device according to some embodiments.

Referring to FIG. 13, the semiconductor memory chip 1300 may include four memory banks Bank A to Bank D 1310. A plurality of sub-cell blocks including a plurality of STT-MRAM cells may be disposed in each of the banks 1310. A row decoder 1320 and a column decoder 1330 may be disposed adjacent to each of the banks 1310. Also, pads PAD used to communicate with the outside may be disposed in peripheral regions disposed in the edges and center of the semiconductor memory chip 1300. Furthermore, source line voltage generators 1341 and 1342 may be disposed in the peripheral region disposed in the center of the semiconductor memory chip 1300. Row decoders 1320, column decoders 1330, and the source line voltage generators 1341 and 1342 may constitute peripheral circuits.

Although FIG. 13 shows an embodiment in which two source line voltage generators 1341 and 1342 are provided, source line voltage generators may be provided in equal number to the number of memory banks 1310 so that source line driving voltages can be respectively applied to the memory banks 1310. Alternatively, one source line voltage generator may be provided in the peripheral region of the semiconductor memory chip 1300, and apply a source line driving voltage to each of all the memory banks 1310 of the semiconductor memory chip 1300.

The row decoders 1320 may be disposed in a minor-axis direction of the semiconductor memory chip 1300, while the column decoders 1330 may be disposed in a major-axis direction thereof. Furthermore, the row decoders 1320 allocated respectively to two adjacent memory banks 1310 may be disposed adjacent to each other and share a control line (not shown) therebetween.

In some embodiments, the number of memory banks 1310 of the semiconductor memory chip 1300 may not be 4 but be 8 or more.

Figure 14:
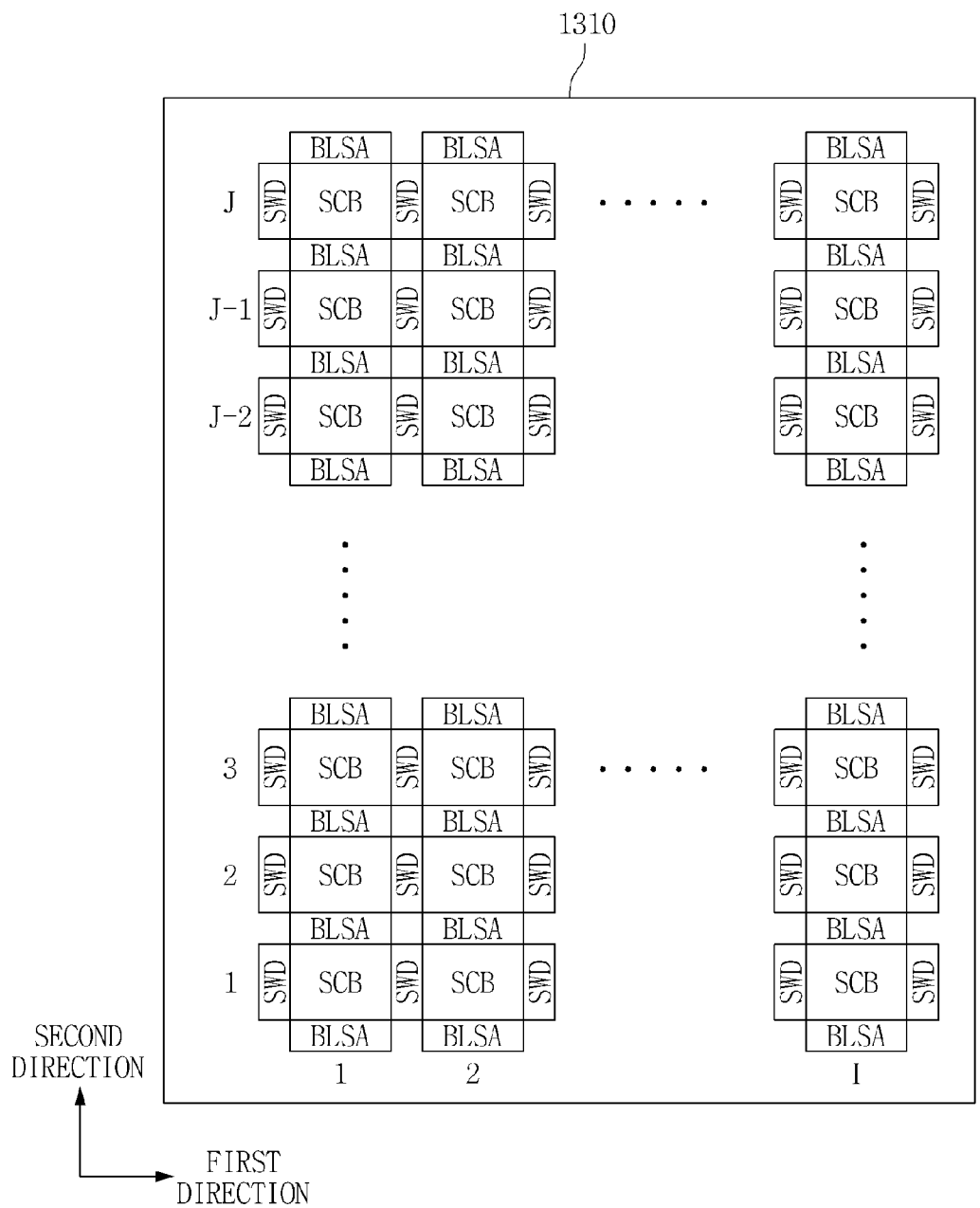
FIG. 14 illustrates an exemplary layout of a memory bank shown in FIG. 13 according to some embodiments.

FIG. 14 illustrates an exemplary layout of the memory bank 1310 shown in FIG. 13 according to some embodiments.

Referring to FIG. 14, in the memory bank 1310, I sub-cell blocks SCB may be disposed in a first direction, and J sub-cell blocks SCB may be disposed in a second direction orthogonal to the first direction. A plurality of bit lines, a plurality of word lines, and a plurality of STT-MRAM cells may be disposed in each of the sub-cell blocks SCB. The plurality of STT-MRAM cells may be disposed at intersections between the bit lines and the word lines.

I+1 sub-word line driver regions SWD may be disposed between the sub-cell blocks SCB in the first direction. Sub-word line drivers may be disposed in the sub-word line driver regions SWD.

J+1 bit line sense amplifier regions BLSA may be disposed between the sub-cell blocks in the second direction. Sense amplifiers configured to sense data stored in memory cells may be disposed in the bit line sense amplifier regions BLSA.

Figure 15:
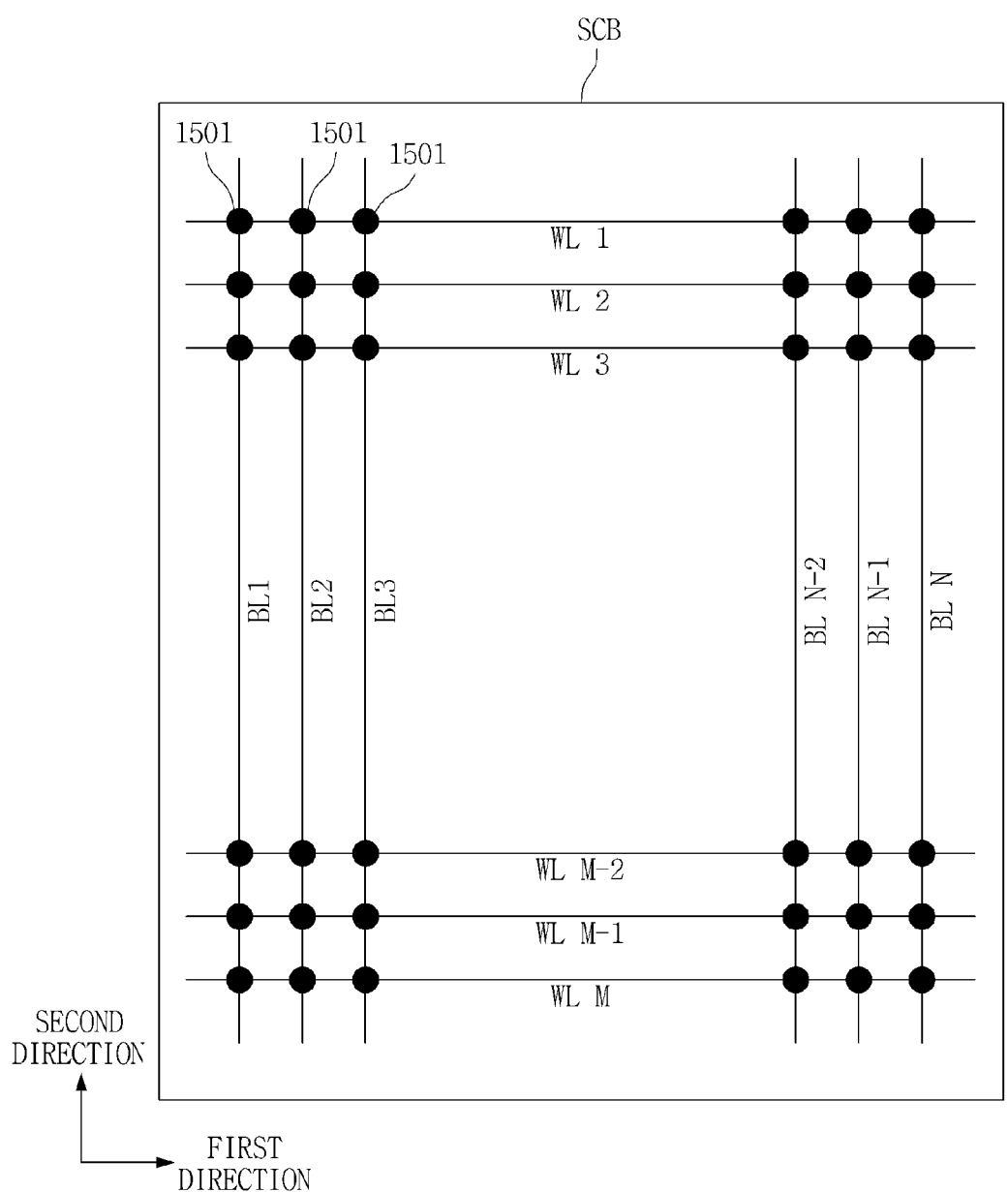
FIG. 15 illustrates an exemplary layout of a sub-cell block shown in FIG. 14 according to some embodiments.

FIG. 15 is an exemplary layout of the sub-cell block SCB shown in FIG. 14 according to some embodiments.

Referring to FIG. 15, the sub-cell block SCB may include M×N memory cells 1501, which may be respectively connected to M word lines WL1 to WLM disposed to extend in the first direction, and M memory cells 1501, which may be respectively connected to N bit lines BL1 to BLN disposed to extend in the second direction orthogonal to the first direction. The memory cells 1501 may be STT-MRAM cells 1501.

Figure 16:
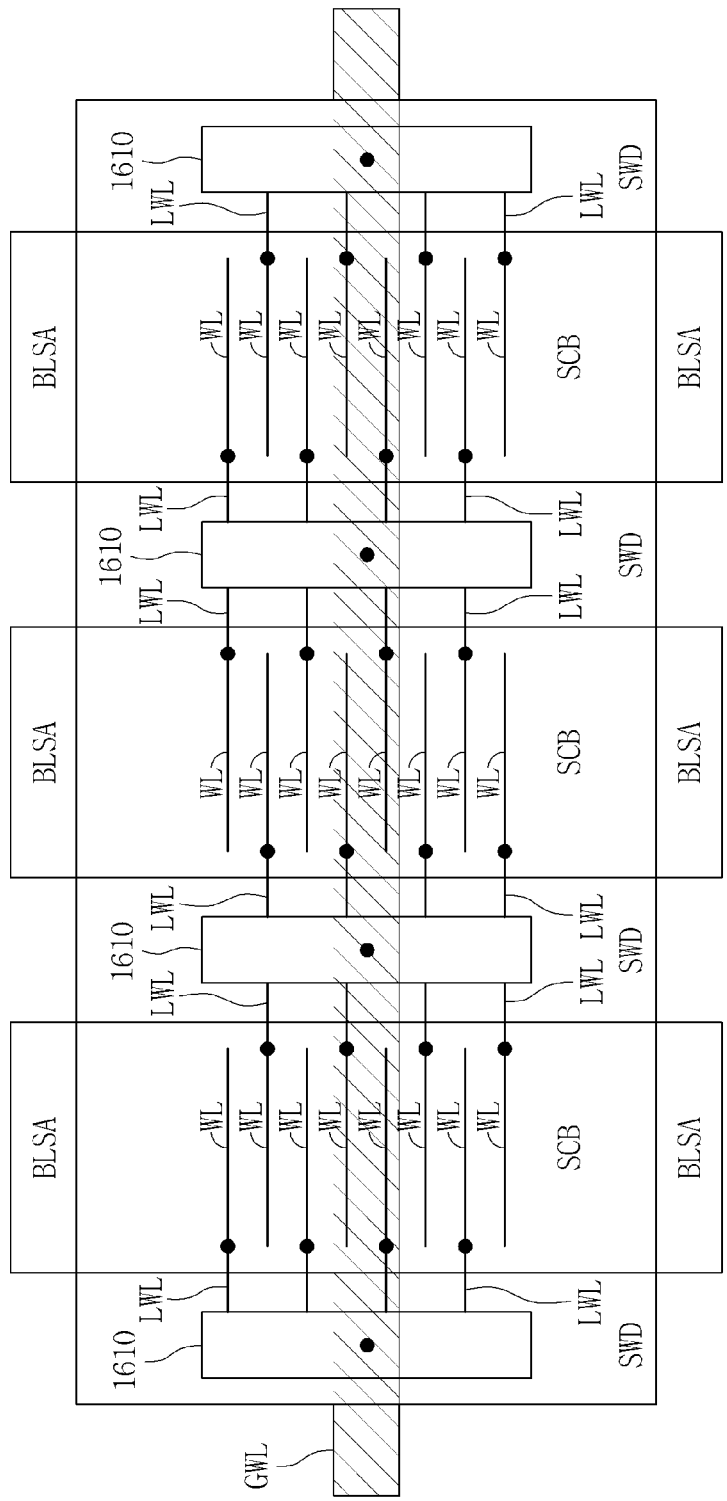
FIG. 16 illustrates an exemplary layout of word lines, local word lines, and a global word line according to one embodiment.

FIG. 16 illustrates an exemplary layout of word lines, local word lines, and a global word line according to one embodiment.

Referring to FIG. 16, local word lines LWL may be disposed in a direction parallel to word lines WL.

A local word line LWL may connect a sub-word line driver 1610 of a sub-word line driver region SWD with a word line WL of a sub-cell block SCB.

From among N word lines disposed in one sub-cell block SCB, N/2 word lines may be respectively connected to N/2 local word lines LWL connected to a sub-word line driver of the sub-word line driver region SWD disposed on one side of a word line direction of the sub-cell block SCB, while the remaining N/2 word lines may be respectively connected to N/2 local word lines LWL connected to a sub-word line driver of the sub-word line driver region SWD disposed on the other side of the word line direction of the sub-cell block SCB. This structure may be referred to as a unit word line connection structure.

In the unit word line connection structure, N/2 of N local word lines may be disposed on one side of the word line direction of the sub-cell block SCB, while N/2 of the N local word lines may be disposed on the other side of the word line direction of the sub-cell block SCB.

The N word lines WL of the unit word line connection structure may be connected in zigzag to the local word lines LWL disposed on both sides of the word line direction of the sub-cell block SCB. For instance, an odd word line WL may be connected to a local word line LWL disposed on one side of the word line direction of the sub-cell block SCB, while an even word line WL may be connected to a local word line LWL disposed on the other side thereof.

Local word lines LWL corresponding to N word lines WL disposed in one sub-cell block SCB may be matched using an A-bit addresses, and a relationship where N is equal to $2^A$ may be satisfied.

A global word line GWL may be connected to a row decoder.

The global word line GWL may be disposed in a different layer from a layer in which the word line WL and the local word line LWL are disposed.

One global word line GWL may be disposed in a direction parallel to the word line WL, and connected to the local word lines LWL of the unit word line connection structure at a ratio of 1:N(=$2^A$) through the sub-word line driver 1610.

Figure 17:
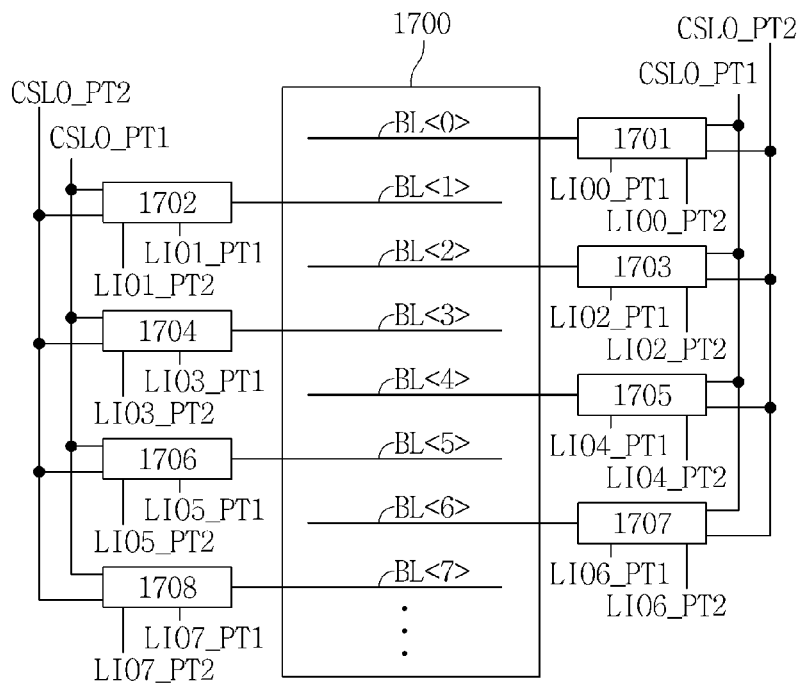
FIG. 17 illustrates an exemplary layout of bit line connection controllers according to according to one embodiment.

FIG. 17 illustrates an exemplary layout of bit line connection controllers according to one embodiment.

Referring to FIG. 17, a bit line selection circuit includes bit line connection controllers, 1701 through 1708, and is configured to select one or more bit lines in response to the column selection signals. In one embodiment, connections of eight bit lines BL<0> to BL<7> of a sub-cell block 1700 with the corresponding local I/O lines LIO0_PT1 to LIO7_PT1 may be controlled using one column selection line CSL0_PT1, or connections of the eight bit lines BL<0> to BL<7> of the sub-cell block 1700 with the corresponding local I/O lines LIO0_PT2 to LIO7_PT2 may be controlled using another column selection line CSL0_PT2.

In one embodiment, referring to FIGS. 17 through 22, signals of the first and second column selection lines CSL_PT1 and CSL_PT2 may be generated from the same column address. An enable time of the signal of the first column selection line CSL_PT1 is faster or slower than an enable time of the signal of the second column selection line CSL_PT2.

Connection of the first bit line BL<0> with the local I/O line may be controlled using a first bit line connection controller 1701 disposed on one outer side of the sub-cell block 1700 in a direction in which the bit lines extend, and connection of the second bit line BL<1> with the local I/O line may be controlled using a second bit line connection controller 1702 disposed on the other outer side of the sub-cell block 1700 in the direction in which the bit lines extend.

Connection of the third bit line BL<2> with the local I/O line may be controlled using a third bit line connection controller 1703 disposed on one outer side of the sub-cell block 1700 in the direction in which the bit lines extend, and connection of the fourth bit line BL<3> with the local I/O line may be controlled using a fourth bit line connection controller 1704 disposed on the other outer side of the sub-cell block 1700 in the direction in which the bit lines extend.

Connection of the fifth bit line BL<4> with the local I/O line may be controlled using a fifth bit line connection controller 1705 disposed on one outer side of the sub-cell block 1700 in the direction in which the bit lines extend, and connection of the sixth bit line BL<5> with the local I/O line may be controlled using a sixth bit line connection controller 1706 disposed on the other outer side of the sub-cell block 1700 in the direction in which the bit lines extend.

Connection of the seventh bit line BL<6> with the local I/O line may be controlled using a seventh bit line connection controller 1707 disposed on one outer side of the sub-cell block 1700 in the direction in which the bit lines extend, and connection of the eighth bit lines BL<7> with the local I/O line may be controlled using an eighth bit line connection controller 1708 disposed on the other outer side of the sub-cell block 1700 in the direction in which the bit lines extend.

Figure 18:
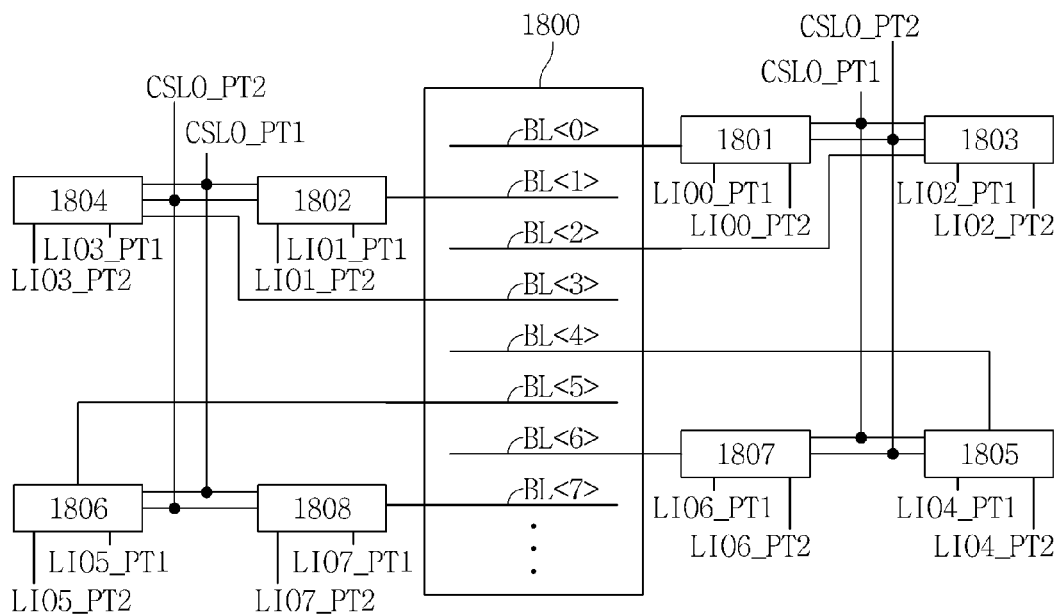
FIG. 18 illustrates an exemplary layout of bit line connection controllers according to according to one embodiment.

FIG. 18 illustrates an exemplary layout of bit line connection controllers according to one embodiment.

Referring to FIG. 18, a bit line selection circuit includes bit line connection controllers, 1801 through 1808, and is configured to select one or more bit lines in response to the column selection signals. In one embodiment, connections of eight bit lines BL<0> to BL<7> of a sub-cell block 1800 with the corresponding local I/O lines LIO0_PT1 to LIO7_PT1 may be controlled using one column selection line CSL0_PT1, or connections of the eight bit lines BL<0> to BL<7> of the sub-cell block 1800 with the corresponding local I/O lines LIO0_PT2 to LIO7_PT2 may be controlled using another column selection line CSL0_PT2.

Each of a two-stage structure including a first bit line controller 1801 and a third bit line controller 1803 disposed side by side and a two-stage structure including a seventh bit line controller 1807 and a fifth bit line controller 1805 disposed side by side, may be disposed on one outer side of the sub-cell block 1800 in a direction in which bit lines extend.

In addition, each of a two-stage structure including a second bit line controller 1802 and a fourth bit line controller 1804 disposed side by side and a two-stage structure including an eighth bit line controller 1808 and a sixth bit line controller 1806 disposed side by side, may be disposed on the other outer side of the sub-cell block 1800 in the direction in which the bit lines extend.

Connection of the first bit line BL<0> with the local I/O line may be controlled using the first bit line connection controller 1801 disposed on one outer side of the sub-cell block 1800 in which the bit lines extend. Connection of the second bit line BL<1> with the local I/O line may be controlled using the second bit line connection controller 1802 disposed on the other outer side of the sub-cell block 1800 in the direction in which the bit lines extend.

Connection of the third bit line BL<2> with the local I/O line may be controlled using the third bit line connection controller 1803 disposed more outward than the first bit line connection controller 1801 in a direction in which the first bit line connection controller 1801 is disposed. Connection of the fourth bit line BL<3> with the local I/O line may be controlled using the fourth bit line connection controller 1804 disposed more outward than the second bit line connection controller 1802 in a direction in which the second bit line connection controller 1802 is disposed.

Connection of the seventh bit line BL<6> with the local I/O line may be controlled using the seventh bit line connection controller 1807 disposed on one outer side of the sub-cell block 1800 in the direction in which the bit lines extend. Connection of the eighth bit line BL<7> with the local I/O line may be controlled using the eighth bit line connection controller 1808 disposed on the other outer side of the sub-cell block 1800 in the direction in which the bit lines extend.

Connection of the fifth bit line BL<4> with the local I/O line may be controlled using the fifth bit line connection controller 1805 disposed more outward than the seventh bit line connection controller 1807 in a direction in which the seventh bit line connection controller 1807 is disposed. Connection of the sixth bit line BL<5> with the local I/O line may be controlled using the sixth bit line connection controller 1806 disposed more outward than the eighth bit line connection controller 1808 in a direction in which the eighth bit line connection controller 1808 is disposed.

Figure 19:
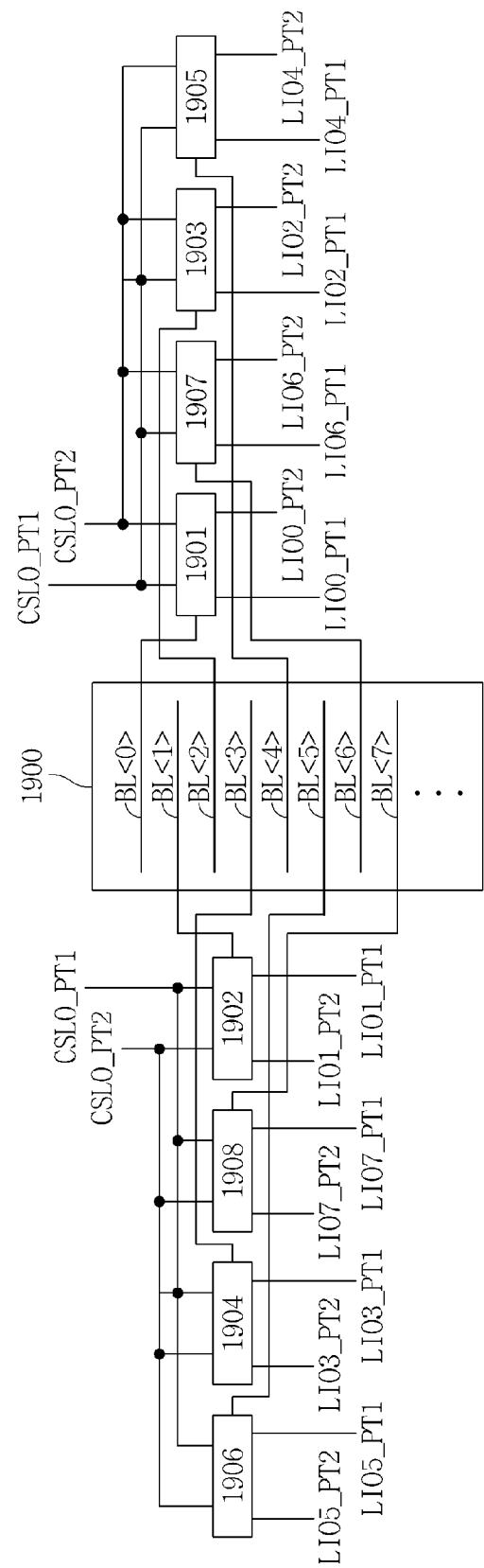
FIG. 19 illustrates an exemplary layout of bit line connection controllers according to according to one embodiment.

FIG. 19 illustrates an exemplary layout of bit line connection controllers according to one embodiment.

Referring to FIG. 19, a bit line selection circuit includes bit line connection controllers, 1901 through 1908, and is configured to select one or more bit lines in response to the column selection signals. In one embodiment, connections of eight bit lines BL<0>~BL<7> of a sub-cell block 1900 with the corresponding local I/O lines LIO0_PT1 to LIO7_PT1 may be controlled using one column selection line CSL0_PT1, or eight bit lines BL<0> to BL<7> of the sub-cell block 1900 with the corresponding local I/O lines LIO0_PT2 to LIO7_PT2 may be controlled using another column selection line CSL0_PT2.

A four-stage structure including a first bit line connection controller 1901, a seventh bit line connection controller 1907, a third bit line connection controller 1903, and a fifth bit line connection controller 1905 disposed side by side, may be disposed on one outer side of the sub-cell block 1900 in a direction in which bit lines extend.

In addition, a four-stage structure including a second bit line connection controller 1902, an eighth bit line connection controller 1908, a fourth bit line connection controller 1904, and a sixth bit line connection controller 1906 disposed side by side, may be disposed on the other outer side of the sub-cell block 1900 in the direction in which the bit lines extend.

Connection of the first bit line BL<0> with the local I/O line may be controlled using the first bit line connection controller 1901 disposed on one outer side of the sub-cell block 1900 in the direction in which the bit lines extend. Connection of the seventh bit line BL<6> with the local I/O line may be controlled using the seventh bit line connection controller 1907 disposed more outward than the first bit line connection controller 1901. Connection of the third bit line BL<2> with the local I/O line may be controlled using the third bit line connection controller 1903 disposed more outward than the seventh bit line connection controller 1907. Connection of the fifth bit line BL<4> with the local I/O line may be controlled using the fifth bit line connection controller 1905 disposed more outward than the third bit line connection controller 1903.

Furthermore, connection of the second bit line BL<1> with the local I/O line may be controlled using the second bit line connection controller 1902 disposed on the other outer side of the sub-cell block 1900 in the direction in which the bit lines extend. Connection of the eighth bit line BL<7> with the local I/O line may be controlled using the eighth bit line connection controller 1908 disposed more outward than the second bit line connection controller 1902. Connection of the fourth bit line BL<3> with the local I/O line may be controlled using the fourth bit line connection controller 1904 disposed more outward than the eighth bit line connection controller 1908. Connection of the sixth bit line BL<5> with the local I/O line may be controlled using the sixth bit line connection controller 1906 disposed more outward than the fourth bit line connection controller 1904.

Figure 20:
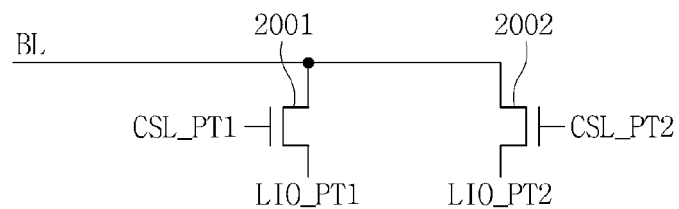
FIG. 20 is an exemplary circuit diagram of a bit line connection controller according to according to one embodiment.

FIG. 20 is an exemplary circuit diagram of a bit line connection controller according to one embodiment.

Referring to FIG. 20, a bit line BL may be connected to one source/drain terminal of each of a first column selection line transistor 2001 and a second column selection line transistor 2002.

A gate terminal of the first column selection line transistor 2001 may be connected to a first column selection line CSL_PT1 linked with a first port, and another source/drain terminal of the first column selection line transistor 2001 may be connected to a first local input/output (I/O) line LIO_PT1 linked with the first port. The first column selection line transistor 2001 may be an NMOS transistor.

When a high-level voltage is applied to the first column selection line CSL_PT1, the first column selection line transistor 2001 may be turned on, while the bit line BL and the first local I/O line LIO_PT1 may be electrically connected to each other.

Data read through the bit line BL and the first local I/O line LIO_PT1 may be transmitted through the first port to the outside of a memory device.

A gate terminal of the second column selection line transistor 2002 may be connected to a second column selection line CSL_PT2 linked with a second port, and another source/drain terminal of the second column selection line transistor 2002 may be connected to a second local I/O line LIO_PT2 linked with the second port. The second column selection line transistor 2002 may be an NMOS transistor.

When a high-level voltage is applied to the second column selection line CSL_PT2, the second column selection line transistor 2002 may be turned on, and the bit line BL and the second local I/O line LIO_PT2 may be electrically connected to each other.

Data read through the bit line BL and the second local I/O line LIO_PT2 may be transmitted through the second port to the outside of the memory device.

Figure 21:
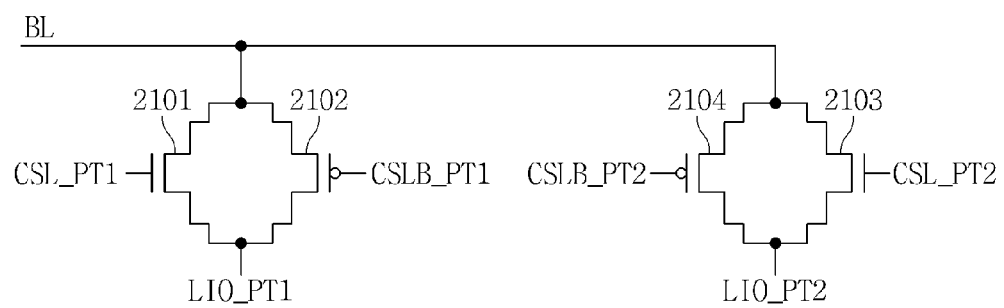
FIG. 21 is an exemplary circuit diagram of a bit line connection controller according to according to one embodiment.

FIG. 21 is an exemplary circuit diagram of a bit line connection controller according to one embodiment.

Referring to FIG. 21, a bit line BL may be connected to one source/drain terminal of each of a first-conductivity-type first column selection line transistor 2101 and a second-conductivity-type first column selection line transistor 2102. Also, the bit line BL may be connected to one source/drain terminal of each of a first-conductivity-type second column selection line transistor 2103 and a second-conductivity-type second column selection line transistor 2104.

A gate terminal of the first-conductivity-type first column selection line transistor 2101 may be connected to a first column selection line CSL_PT1 linked with a first port, while another source/drain terminal of the first-conductivity-type first column selection line transistor 2101 may be connected to a first local I/O line LIO_PT1 linked with the first port. The first-conductivity-type first column selection line transistor 2101 may be an NMOS transistor.

A gate terminal of the second-conductivity-type first column selection line transistor 2102 may be connected to a first complementary column selection line CSLB_PT1 linked with the first port, while another source/drain terminal of the second-conductivity-type first column selection line transistor 2102 may be connected to the first local I/O line LIO_PT1 linked with the first port. The second-conductivity-type first column selection line transistor 2102 may be a PMOS transistor.

Each of the first-conductivity-type first column selection line transistor 2101 and the second-conductivity-type first column selection line transistor 2102 may function as a first CMOS transmission gate.

When a high-level voltage is applied to the first column selection line CSL_PT1 linked with the first port and a low-level voltage is applied to the first complementary column selection line CSLB_PT1 linked with the first port, the first CMOS transmission gate may be turned on, the bit line BL and the first local I/O line LIO_PT1 may be electrically connected to each other, and a voltage of the bit line BL may be transmitted at full level to the first local I/O line LIO_PT1.

Data read through the bit line BL and the first local I/O line LIO_PT1 may be transmitted through the first port to the outside of a memory device.

A gate terminal of the first-conductivity-type second column selection line transistor 2103 may be connected to a second column selection line CSL_PT2 linked with a second port, while another source/drain terminal of the first-conductivity-type second column selection line transistor 2103 may be connected to a second local I/O line LIO_PT2 linked with the second port. The first-conductivity-type second column selection line transistor 2103 may be an NMOS transistor.

A gate terminal of the second-conductivity-type second column selection line transistor 2104 may be connected to a second complementary column selection line CSLB_PT2 linked with the second port, while another source/drain terminal of the second-conductivity-type second column selection line transistor 2104 may be connected to a second local I/O line LIO_PT2 linked with the second port. The second-conductivity-type second column selection line transistor 2104 may be a PMOS transistor.

The first-conductivity-type second column selection line transistor 2103 and the second-conductivity-type second column selection line transistor 2104 may function as a second CMOS transmission gate.

When a high-level voltage is applied to the second column selection line CSL_PT2 linked with the second port and a low-level voltage is applied to the second complementary column selection line CSLB_PT2 linked with the second port, the second CMOS transmission gate may be turned on, the bit line BL and the second local I/O line LIO_PT2 may be electrically connected to each other, and a voltage of the bit line BL may be transmitted at full level to the second local I/O line LIO_PT1.

Data read through the bit line BL and the second local I/O line LIO_PT2 may be transmitted through the second port to the outside of the memory device.

Figure 22:
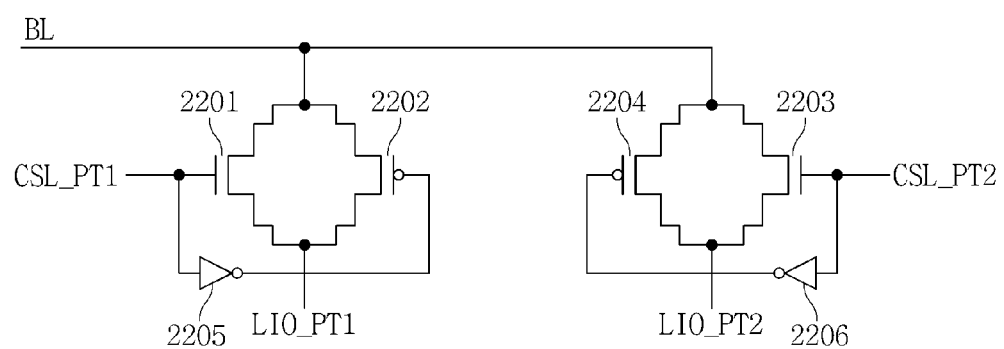
FIG. 22 is an exemplary circuit diagram of a bit line connection controller according to according to one embodiment.

FIG. 22 is an exemplary circuit diagram of a bit line connection controller according to one embodiment.

Referring to FIG. 22, a bit line BL may be connected to one source/drain terminal of each of a first-conductivity-type first column selection line transistor 2201 and a second-conductivity-type first column selection line transistor 2202. Also, the bit line BL may be connected to one source/drain terminal of each of a first-conductivity-type second column selection line transistor 2203 and a second-conductivity-type second column selection line transistor 2204.

A gate terminal of the first-conductivity-type first column selection line transistor 2201 and an input terminal of a first inverter 2205 may be connected to a first column selection line CSL_PT1 linked with a first port, and another source/drain terminal of the first-conductivity-type first column selection line transistor 2201 may be connected to a first local I/O line LIO_PT1 linked with the first port. The first-conductivity-type first column selection line transistor 2201 may be an NMOS transistor.

A gate terminal of the second-conductivity-type first column selection line transistor 2202 may be connected to an output terminal of the first inverter 2205, another source/drain terminal of the second-conductivity-type first column selection line transistor 2202 may be connected to the first local I/O line LIO_PT1 linked with the first port. The second-conductivity-type first column selection line transistor 2202 may be a PMOS transistor.

The first-conductivity-type first column selection line transistor 2201 and the second-conductivity-type first column selection line transistor 2202 may function as a first CMOS transmission gate.

When a high-level voltage is applied to the first column selection line CSL_PT1 linked with the first port, the first CMOS transmission gate may be turned on, the bit line BL and the first local I/O line LIO_PT1 may be electrically connected to each other, and a voltage of the bit line BL may be transmitted at full level to the first local I/O line LIO_PT1.

Data read through the bit line BL and the first local I/O line LIO_PT1 may be transmitted through the first port to the outside of a memory device.

A gate terminal of the first-conductivity-type second column selection line transistor 2203 and an input terminal of a second inverter 2206 may be connected to a second column selection line CSL_PT2 linked with a second port, and another source/drain terminal of the first-conductivity-type second column selection line transistor 2203 may be connected to a second local I/O line LIO_PT2 linked with the second port. The first-conductivity-type second column selection line transistor 2203 may be an NMOS transistor.

A gate terminal of the second-conductivity-type second column selection line transistor 2204 may be connected to an output terminal of the second inverter 2206, and another source/drain terminal of the second-conductivity-type second column selection line transistor 2204 may be connected to the second local I/O line LIO_PT2 linked with the second port. The second-conductivity-type second column selection line transistor 2204 may be a PMOS transistor.

The first-conductivity-type second column selection line transistor 2203 and the second-conductivity-type second column selection line transistor 2204 may function as a second CMOS transmission gate.

When a high-level voltage is applied to the second column selection line CSL_PT2 linked with the second port, the second CMOS may be turned on, the bit line BL and the second local I/O line LIO_PT2 may be electrically connected to each other, and a voltage of the bit line BL may be transmitted at full level to the second local I/O line LIO_PT2.

Data read through the bit line BL and the second local I/O line LIO_PT2 may be transmitted through the second port to the outside of the memory device.

Figure 23:
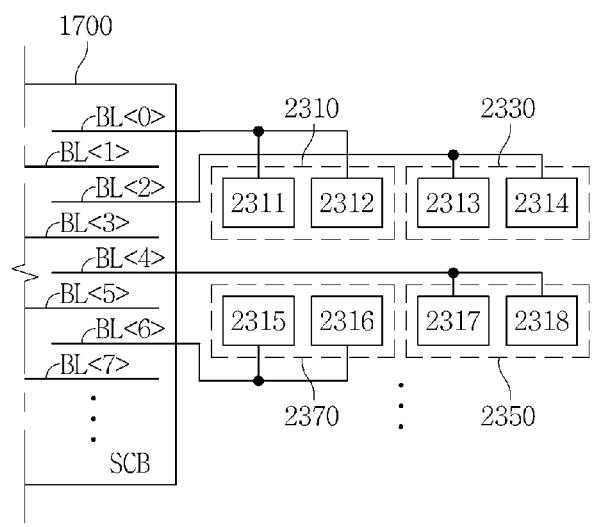
FIG. 23 is an exemplary diagram of the bit line connection controller of FIG. 20 according to one embodiment.

FIG. 23 is an exemplary diagram of the bit line connection controller of FIG. 20 according to one embodiment.

Referring to FIG. 23, a first column selection line transistor 2311 connected to a first bit line BL<0>, a second column selection line transistor 2312 connected to the first bit line BL<0>, a first column selection line transistor 2313 connected to a third bit line BL<2>, and a second column selection line transistor 2314 connected to the third bit line BL<2> may be sequentially disposed side by side in a first column in a direction in which bit lines extend.

The first column selection line transistor 2311 and the second column selection line transistor 2312, which are connected to the first bit line BL<0>, may form a first bit line connection controller 2310.

The first column selection line transistor 2313 and the second column selection line transistor 2314, which are connected to the third bit line BL<2>, may form a third bit line connection controller 2330.

A first column selection line transistor 2315 connected to a seventh bit line BL<6>, a second column selection line transistor 2316 connected to the seventh bit line BL<6>, a first column selection line transistor 2317 connected to a fifth bit line BL<4>, and a second column selection line transistor 2318 connected to the fifth bit line BL<4> may be sequentially disposed side by side in a second column in the direction in which the bit lines extend.

The first column selection line transistor 2317 and the second column selection line transistor 2318, which are connected to the fifth bit line BL<4>, may form a fifth bit line connection controller 2350.

The first column selection line transistor 2315 and the second column selection line transistor 2316, which are connected to the seventh bit line BL<6>, may form a seventh bit line connection controller 2370.

Although not shown, two-stage architectures of bit line connection controllers including a second bit line BL<1>, a fourth bit line BL<3>, a sixth bit line BL<5>, and an eighth bit line BL<7>, may be symmetrically formed on the opposite side of a sub-cell block SCB in a similar manner to that described above.

Although not shown, bit line connection controllers including eight bit lines of the remaining bit lines of the sub-cell block SCB as one unit, may be formed in two stages in a similar manner to that described above.

Figure 24:
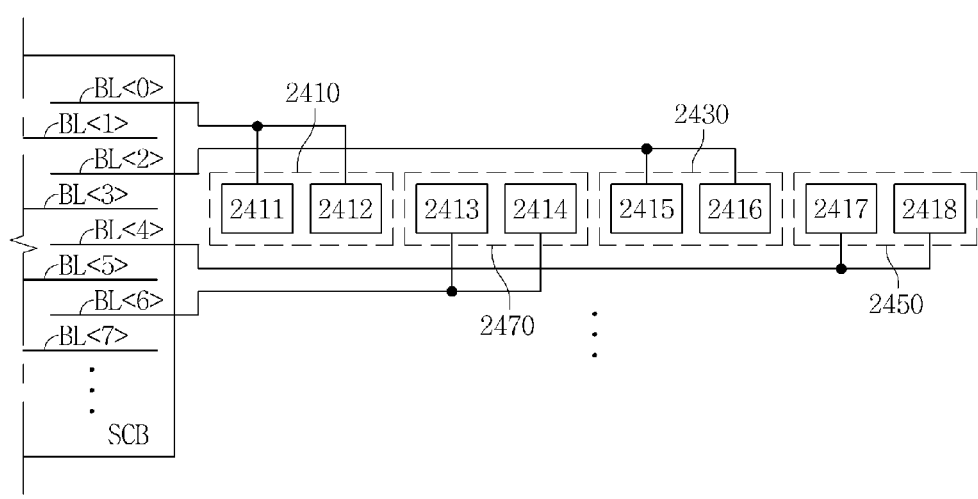
FIG. 24 is an exemplary diagram of the bit line connection controller of FIG. 20 according to one embodiment.

FIG. 24 is an exemplary diagram of the bit line connection controller of FIG. 20 according to one embodiment.

Referring to FIG. 24, a first column selection line transistor 2411 connected to a first bit line BL<0>, a second column selection line transistor 2412 connected to the first bit line BL<0>, a first column selection line transistor 2413 connected to a seventh bit line BL<6>, a second column selection line transistor 2414 connected to the seventh bit line BL<6>, a first column selection line transistor 2415 connected to a third bit line BL<2>, a second column selection line transistor 2416 connected to the third bit line BL<2>, a first column selection line transistor 2417 connected to a fifth bit line BL<4>, and a second column selection line transistor 2418 connected to the fifth bit line BL<4> may be sequentially disposed side by side in a direction in which bit lines extend.

The first column selection line transistor 2411 and the second column selection line transistor 2412, which are connected to the first bit line BL<0>, may form a first bit line connection controller 2410.

The first column selection line transistor 2415 and the second column selection line transistor 2416, which are connected to the third bit line BL<2>, may form a third bit line connection controller 2430.

The first column selection line transistor 2417 and the second column selection line transistor 2418, which are connected to the fifth bit line BL<4>, may form a fifth bit line connection controller 2450.

The first column selection line transistor 2413 and the second column selection line transistor 2414, which are connected to the seventh bit line BL<6>, may form a seventh bit line connection controller 2470.

Although not shown, four-stage architectures of bit line connection controllers including a second bit line BL<1>, a fourth bit line BL<3>, a sixth bit line BL<5>, and an eighth bit line BL<7>, may be symmetrically formed on the opposite side of a sub-cell block SCB in a similar manner to that described above.

Although not shown, bit line connection controllers including eight bit lines of the remaining bit lines of the sub-cell block SCB as one unit, may be formed in four stages in a similar manner to that described above.

Figure 25:
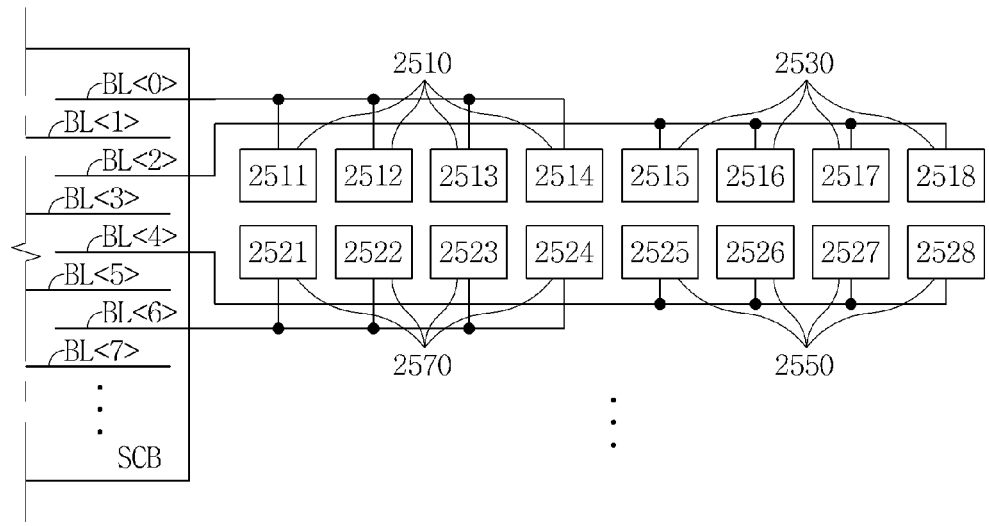
FIG. 25 is an exemplary diagram of the bit line connection controller of FIG. 21 according to one embodiment.

FIG. 25 is an exemplary diagram of the bit line connection controller of FIG. 21 according to one embodiment.

Referring to FIG. 25, a first-conductivity-type first column selection line transistor 2511 connected to a first bit line BL<0>, a second-conductivity-type first column selection line transistor 2512 connected to the first bit line BL<0>, a first-conductivity-type second column selection line transistor 2513 connected to the first bit line BL<0>, a second-conductivity-type second column selection line transistor 2514 connected to the first bit line BL<0>, a first-conductivity-type first column selection line transistor 2515 connected to a third bit line BL<2>, a second-conductivity-type first column selection line transistor 2516 connected to the third bit line BL<2>, a first-conductivity-type second column selection line transistor 2517 connected to the third bit line BL<2>, and a second-conductivity-type second column selection line transistor 2518 connected to the third bit line BL<2> may be sequentially disposed side by side in a first column in a direction in which bit lines extend.

The four transistors 2511, 2512, 2513, and 2514, which are connected to the first bit line BL<0>, may form a first bit line connection controller 2510.

The four transistors 2515, 2516, 2517, and 2518, which are connected to the third bit line BL<2>, may form a third bit line connection controller 2530.

Furthermore, a first-conductivity-type first column selection line transistor 2521 connected to a seventh bit line BL<6>, a second-conductivity-type first column selection line transistor 2522 connected to the seventh bit line BL<6>, a first-conductivity-type second column selection line transistor 2523 connected to the seventh bit line BL<6>, a second-conductivity-type second column selection line transistor 2524 connected to the seventh bit line BL<6>, a first-conductivity-type first column selection line transistor 2525 connected to a fifth bit line BL<4>, a second-conductivity-type first column selection line transistor 2526 connected to the fifth bit line BL<4>, a first-conductivity-type second column selection line transistor 2527 connected to the fifth bit line BL<4>, and a second-conductivity-type second column selection line transistor 2528 connected to the fifth bit line BL<4> may be sequentially disposed side by side in a second column in the direction in which the bit lines extend.

The four transistors 2525, 2526, 2527, and 2528, which are connected to the fifth bit line BL<4>, may form a fifth bit line connection controller 2550.

The four transistors 2521, 2522, 2523, and 2524, which are connected to the seventh bit line BL<6>, may form a seventh bit line connection controller 2570.

Although not shown, two-stage architectures of bit line connection controllers including a second bit line BL<1>, a fourth bit line BL<3>, a sixth bit line BL<5>, and an eighth bit line BL<7>, may be symmetrically formed on the opposite side of a sub-cell block SCB in a similar manner to that described above.

Although not shown, bit line connection controllers including eight bit lines of the remaining bit lines of the sub-cell block SCB as one unit, may be formed in two stages in a similar manner to that described above.

Figure 26:
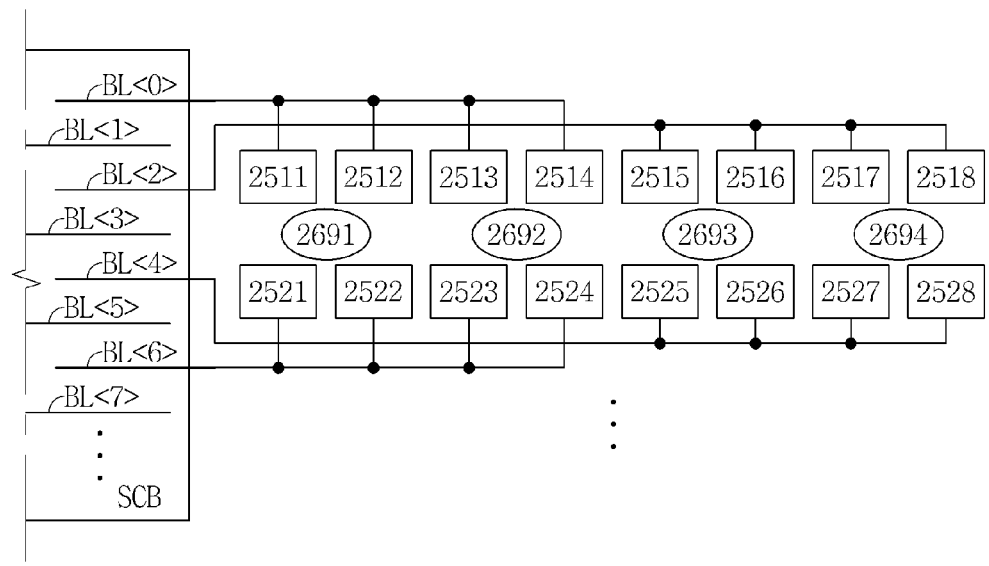
FIG. 26 is an exemplary diagram of the bit line connection controller of FIG. 22 according to one embodiment.

FIG. 26 is an exemplary diagram of the bit line connection controller of FIG. 22 according to one embodiment.

Referring to FIG. 26, since the disposition of column selection line transistors is the same as described with reference to FIG. 25, a detailed description thereof is omitted.

In addition, four inverter regions 2691, 2692, 2693, and 2694 may be disposed between first and second columns in which the column selection line transistors are disposed, and between first- and second-conductivity-type transistors.

In the first inverter region 2691, an inverter configured to connect gates of a first-conductivity-type first column selection line transistor 2511 and a second-conductivity-type first column selection line transistor 2512 of a first bit line connection controller, and an inverter configured to connect gates of a first-conductivity-type first column selection line transistor 2521 and a second-conductivity-type first column selection line transistor 2522 of a seventh bit line connection controller may be disposed.

In the second inverter region 2692, an inverter configured to connect gates of a first-conductivity-type second column selection line transistor 2513 and a second-conductivity-type second column selection line transistor 251 of the first bit line connection controller, and an inverter configured to connect gates of a first-conductivity-type second column selection line transistor 2523 and a second-conductivity-type second column selection line transistor 2524 of the seventh bit line connection controller may be disposed.

In the third inverter region 2693, an inverter configured to connect gates of a first-conductivity-type first column selection line transistor 2515 and a second-conductivity-type first column selection line transistor 2516 of a third bit line connection controller, and an inverter configured to connect gates of a first-conductivity-type first column selection line transistor 2525 and a second-conductivity-type first column selection line transistor 2526 of a fifth bit line connection controller may be disposed.

In the fourth inverter region 2694, an inverter configured to connect gates of a first-conductivity-type second column selection line transistor 2517 and a second-conductivity-type second column selection line transistor 2518 of the third bit line connection controller, and an inverter configured to connect gates of a first-conductivity-type second column selection line transistor 2527 and a second-conductivity-type second column selection line transistor 2528 of the fifth bit line connection controller may be disposed.

Although not shown, two-stage architectures of bit line connection controllers including a second bit line BL<1>, a fourth bit line BL<3>, a sixth bit line BL<5>, and an eighth bit line BL<7>, may be symmetrically formed on the opposite side of the sub-cell block SCB in a similar manner to that described above.

Although not shown, bit line connection controllers including eight bit lines of the remaining bit lines of the sub-cell block SCB as one unit, may be formed in two stages in a similar manner to that described above.

By disposing the bit line connection controllers in two stages or four stages according to the embodiments of the inventive concept, magneto-resistive memory devices may efficiently cope with a reduction in pitch between bit lines.

Figure 27:
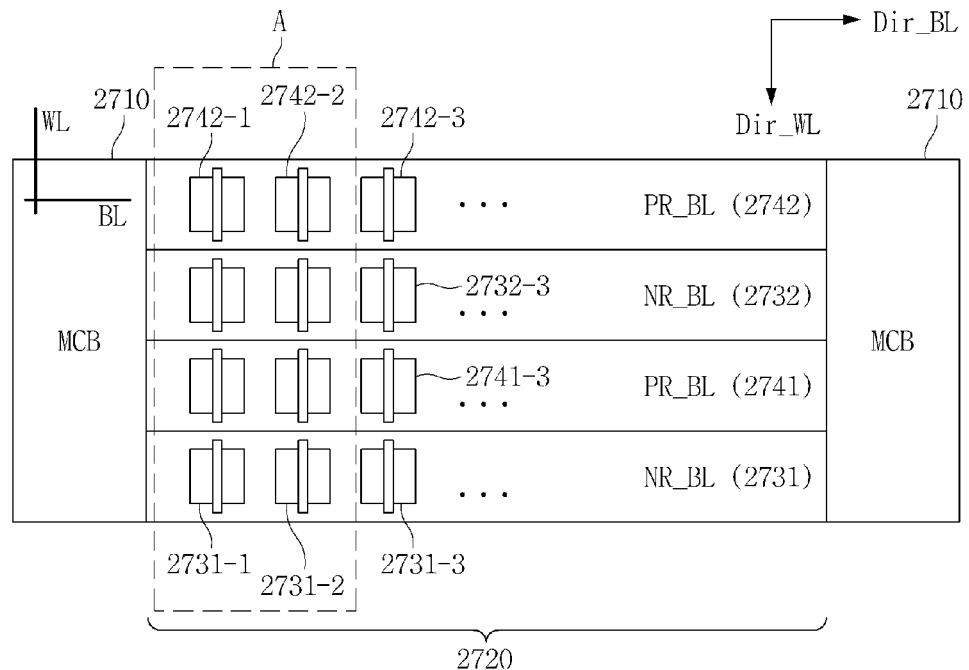
FIG. 27 is an exemplary diagram for explaining the layout of transistors in a bit line sense amplifier region according to one embodiment.

FIG. 27 is an exemplary diagram for explaining the layout of transistors in a bit line sense amplifier region according to one embodiment.

Referring to FIG. 27, a bit line sense amplifier region (BLSA) 2720 may be disposed between memory cell blocks (MCB, or SCB) 2710 in a bit line direction Dir_BL.

Conductivity-type transistor regions including N regions NR_BL 2731 and 2732 in which NMOS transistors are disposed and P regions PR_BL 2741 and 2742 in which PMOS transistors are disposed, may be elongatively formed in the bit line sense amplifier region BLSA 2720 in the bit line direction Dir_BL. Conductivity-type transistor regions having different conductivity types may be alternately formed in a word line direction Dir_WL. In some embodiments, the P regions may be disposed on one side, while the N regions may be disposed on another side.

A plurality of NMOS transistors 2731-1, 2731-2, and 2731-3 may be disposed in a row in the N region 2731 in the bit line direction Dir_BL, while a plurality of NMOS transistors 2732-1, 2732-2, and 2732-3 may be disposed in a row in the N region 2732 in the bit line direction Dir_BL.

A plurality of PMOS transistors 2741-1, 2741-2, and 2741-3 may be disposed in a row in the P region 2741 in the bit line direction Dir_BL, while a plurality of PMOS transistors 2742-1, 2742-2, and 2742-3 may be disposed in a row in the P region 2742.

Figure 28:
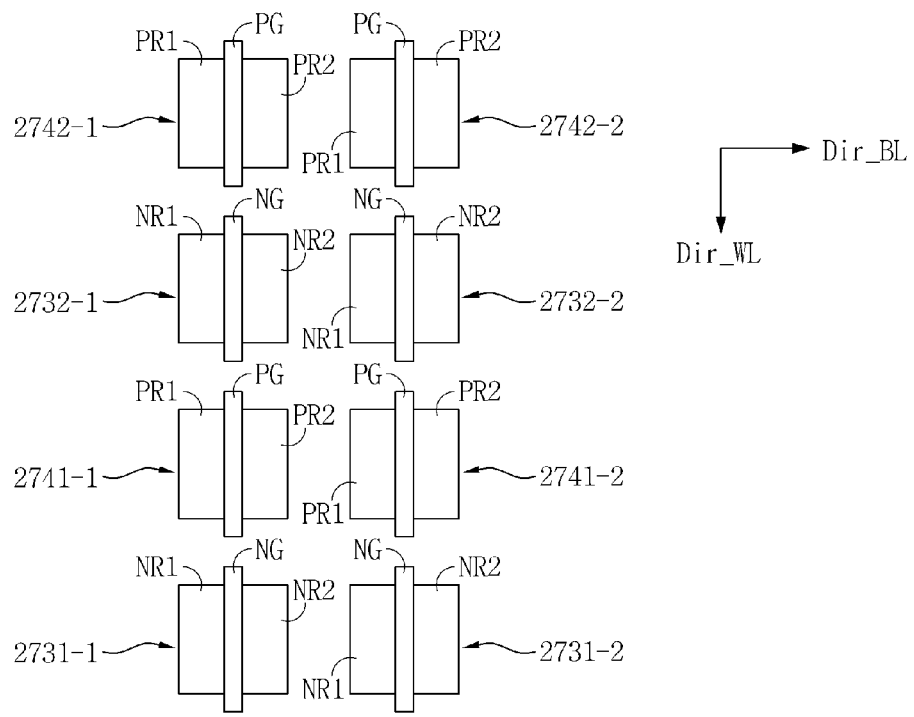
FIG. 28 is a partial enlarged view of the layout of the transistor shown in FIG. 27 according to one embodiment.

FIG. 28 is a partial enlarged view of the layout of the transistor shown in FIG. 27 according to one embodiment.

Referring to FIG. 28, which is an enlarged view of portion A of FIG. 27, each of the NMOS transistors 2731-1, 2731-2, 2732-1, and 2732-2 may include a gate line NG disposed across an active region with a predetermined size in the word line direction Dir_WL and conductive regions NR1 and NR2 into which the active region is divided by the gate line NG. The conductive regions NR1 and NR2 may refer to source/drain regions. A channel of each of the NMOS transistors 2731-1, 2731-2, 2732-1, and 2732-2 may be formed in the bit line direction Dir_BL.

Each of the PMOS transistors 2741-1, 2741-2, 2742-1, and 2742-2 may include a gate line PG disposed across an active region with a predetermined size in the word line direction Dir_WL and conductive regions PR1 and PR2 into which the active region is divided by the gate line PG. The conductive regions PR1 and PR2 may refer to source/drain regions. A channel of each of the PMOS transistors 2741-1, 2741-2, 2742-1, and 2742-2 may be formed in the bit line direction Dir_BL.

Figure 29:
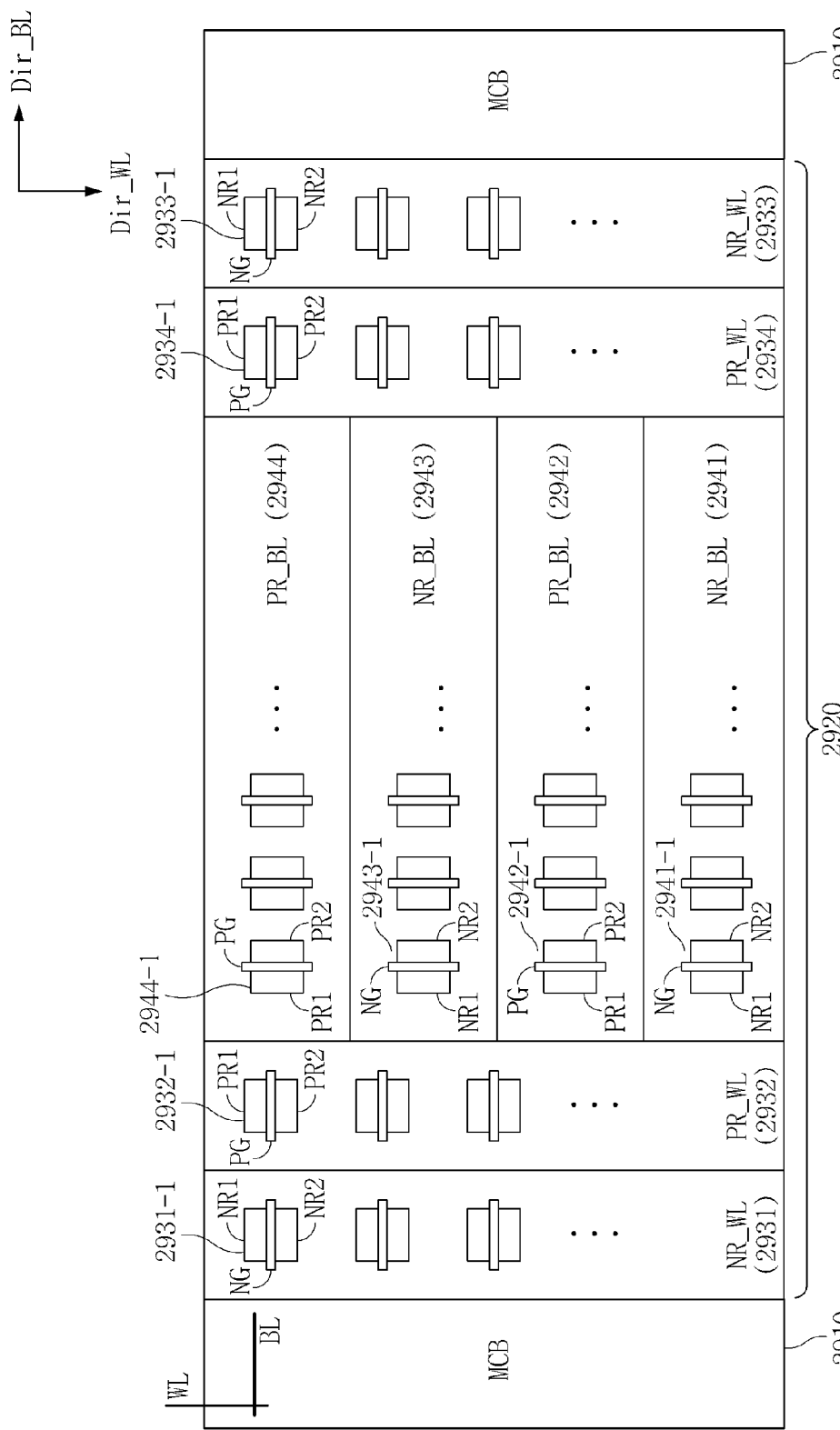
FIG. 29 is an exemplary diagram for explaining the layout of transistors in a bit line sense amplifier region according to one embodiment.

FIG. 29 is an exemplary diagram for explaining the layout of transistors in a bit line sense amplifier region according to one embodiment.

Referring to FIG. 29, a bit line sense amplifier region BLSA 2920 may be disposed between MCBs 2910 in a bit line direction Dir_BL.

In the bit line sense amplifier region BLSA 2920, N regions NR_WL 2931 and 2933 in which NMOS transistors are disposed and P regions PR_WL 2932 and 2934 in which PMOS transistors are disposed, may be elongatively formed in the word line direction Dir_WL. Also, N regions NR_BL 2941 and 2943 in which NMOS transistors are disposed and P regions PR_BL 2942 and 2944 in which PMOS transistors are disposed, may be elongatively formed in the bit line direction Dir_BL.

A plurality of NMOS transistors 2931-1 may be disposed in a row in the N region NR_WL 2931 elongated in the word line direction Dir_WL, and a plurality of NMOS transistors 2933-1 may be disposed in a row in the N region NR_WL 2933 elongated in the word line direction Dir_WL. Also, a plurality of PMOS transistors 2932-1 may be disposed in a row in the P region PR_WL 2932 elongated in the word line direction Dir_WL, and a plurality of PMOS transistors 2934-1 may be disposed in a row in the P region PR_WL 2934 elongated in the word line direction Dir_WL.

Each of the transistors 2931-1 and 2933-1 disposed in the N regions NR_WL 2931 and 2933 elongated in the word line direction Dir_WL may include a gate line NG disposed across an active region with a predetermined size and conductive regions NR1 and NR2 into which the active region is divided by the gate line NG. Each of the transistors 2932-1 and 2934-1 disposed in the P regions PR_WL 2932 and 2934 elongated in the word line direction Dir_WL may include a gate line PG disposed across an active region with a predetermined size and conductive regions PR1 and PR2 into which the active region is divided by the gate line PG. The conductive regions NR1 and NR2 may refer to source and drain regions, and the conductive regions PR1 and PR2 may refer to source and drain regions. A channel of each of the transistors 2931-1, 2932-1, 2933-1, and 2934-1 may be formed in the word line direction Dir_WL.

A plurality of NMOS transistors 2941-1 may be disposed in a row in the bit line direction Dir_BL in the N region NR_BL 2941 elongated in the bit line direction Dir_BL, and a plurality of NMOS transistors 2943_1 may be disposed in a row in the bit line direction Dir_BL in the N region NR region NR_BL 2943 elongated in the bit line direction Dir_BL. Also, a plurality of PMOS transistors 2942-1 may be disposed in a row in the bit line direction Dir_BL in the P region PR_BL 2942 elongated in the bit line direction Dir_BL, and a plurality of PMOS transistors 2944-1 may be disposed in a row in the bit line direction Dir_BL in the P region PR_BL 2944 elongated in the bit line direction Dir_BL.

Each of the transistors 2941-1 and 2943-1 disposed in the N regions NR_BL 2941 and 2943 elongated in the bit line direction Dir_BL may include a gate line NG disposed across an active region with a predetermined size in the word line direction Dir_WL and conductive regions NR1 and NR2 into which the active region is divided by the gate line NG. Each of the transistors 2942-1 and 2944-1 disposed in the P regions PR_BL 2942 and 2944 elongated in the bit line direction Dir_BL may include a gate line PG disposed across an active region with a predetermined size in the word line direction Dir_WL and conductive regions PR1 and PR2 into which the active region is divided by the gate line PG. The conductive regions NR1 and NR1 may refer to source and drain regions, and the conductive regions PR1 and PR2 may refer to source and drain regions. A channel of each of the transistors 2941-1, 2942-1, 2943-1, and 2944-1 may be formed in the bit line direction Dir_BL.

FIG. 29 shows embodiments in which second-directional conductivity-type transistor regions elongated in the bit line direction Dir_BL are disposed between first-directional conductivity-type transistor regions elongated in the word line direction Dir_WL. However, in some embodiments, first-directional conductivity-type transistor regions may be disposed on one side of a bit line sense amplifier region, while second-directional conductivity-type transistor regions may be disposed on the other side of the bit line sense amplifier region.

In some embodiments, conductivity-type transistor regions (P regions and N regions) may be elongated in the bit line direction Dir_BL in a bit line sense amplifier region. Alternatively, some of the conductivity-type transistor regions (P regions and N regions) may be elongated in the bit line direction Dir_BL, and some thereof may be elongated in the word line direction Dir_WL. Thus, a larger number of transistors in the same space may be disposed in various ways.

Figure 30:
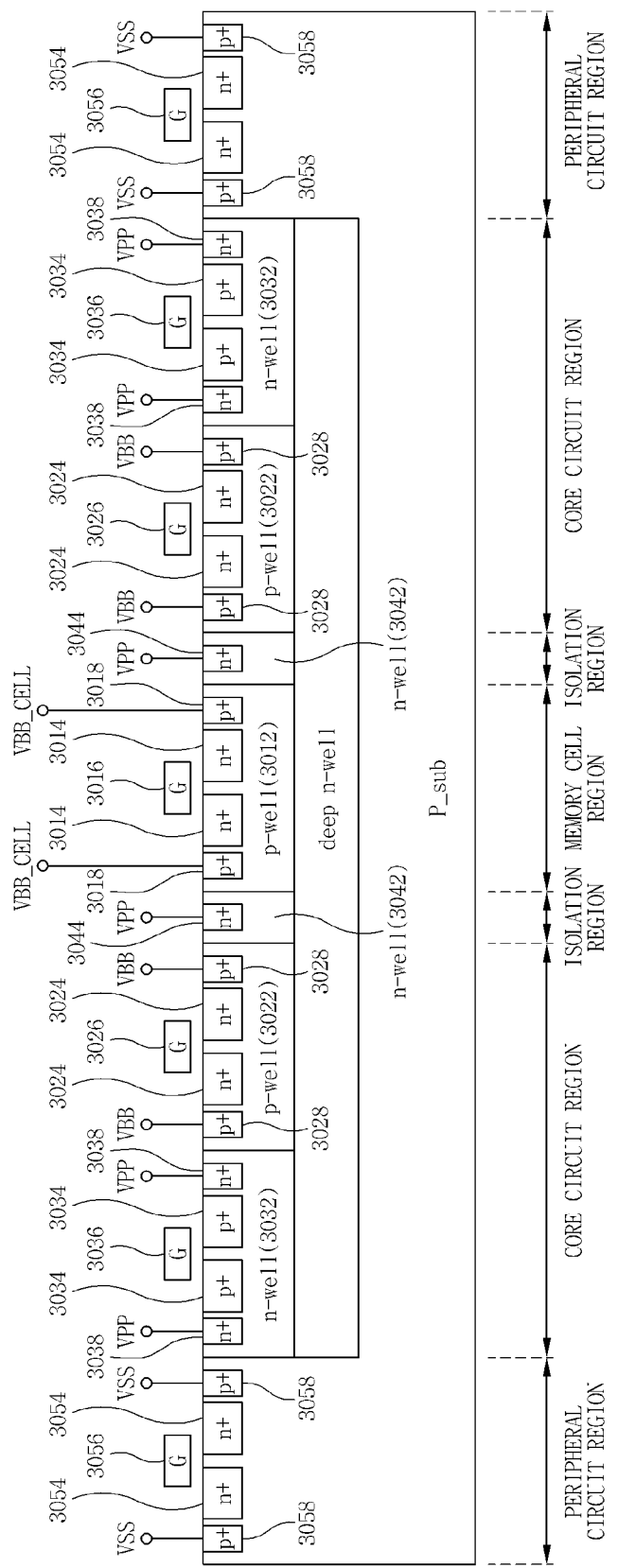
FIG. 30 is an exemplary diagram for explaining a transistor well structure of a magneto-resistive memory device according to one embodiment.

FIG. 30 is an exemplary diagram for explaining a transistor well structure of a magneto-resistive memory device according to one embodiment.

Referring to FIG. 30, the transistor well structure may include a memory cell region, isolation regions, core circuit regions, and peripheral circuit regions, which may be formed in a P-type substrate P_sub.

The memory cell region, the isolation regions, and the core circuit regions may be formed in a deep n-well formed in a partial region of the P-type substrate P_sub, and the peripheral circuit region may be formed in the P-type substrate P_sub.

A memory cell transistor may be formed in the memory cell region, core circuit transistors, such as a sense amplifier transistor and a sub-word line driver transistor, may be formed in each of the core circuit regions, and a peripheral circuit transistor, such as a decoder transistor, may be formed in each of the peripheral circuit regions.

The memory cell transistor may be an NMOS transistor. The memory cell transistor may include a p-well 3012, n+-type regions 3014 formed in the p-well 3012 and serving as a source and a drain, and p+-type regions 3018 formed in the p-well 3012 and connected to first bulk voltage terminals VBB_CELL. For example, a voltage level of the first bulk voltage terminals VBB_CELL may be a ground voltage (0V) or less than 0V.

Each of the core circuit regions may include an inner core circuit region formed on the side of the memory cell region, and an outer core circuit region formed on the side of the peripheral circuit region.

An inner core transistor may be formed in the inner core circuit region, and an outer core transistor may be formed in the outer core circuit region.

The inner core transistor may be an NMOS transistor and include a p-well 3022, n+ regions 3024 formed in the p-well 3022 and serving as a source and a drain, a gate 3026, and p+ regions 3028 formed in the p-well 3022 and connected to second bulk voltage terminals VBB. Inner core transistors may be respectively formed on both sides of the memory cell region adjacent to the memory cell region. For example, a voltage level of the second bulk voltage terminals VBB may be a ground voltage (0V) or less than 0V.

The outer core transistor may be a PMOS transistor and include an n-well 3032, p+ regions 3034 formed in the n-well 3032 and serving as a source and a drain, a gate 3036, and n+ regions 3038 formed in the n-well 3032 and connected to third bulk voltage terminals VPP. For example, a voltage level of the third bulk voltage terminals VPP may be a power supply voltage (VCC or VDD) or greater than VCC or VDD.

The isolation region including an n-well 3042 may be formed between each of inner core circuit regions and the memory cell region so that the p-well 3022 of the inner core transistor can be electrically isolated from the p-well 3012 of the memory cell transistor.

An n+ region 3044 may be formed in the n-well 3042 of each of the isolation regions and connected to a third bulk voltage terminal VPP.

The peripheral circuit transistor may include n+ regions 3054 formed in the P-type substrate P_sub and serving as a source and a drain, a gate 3056, and p+ regions 3058 formed in the P-type substrate P_sub and connected to fourth bulk voltage terminals VSS.

Figure 31:
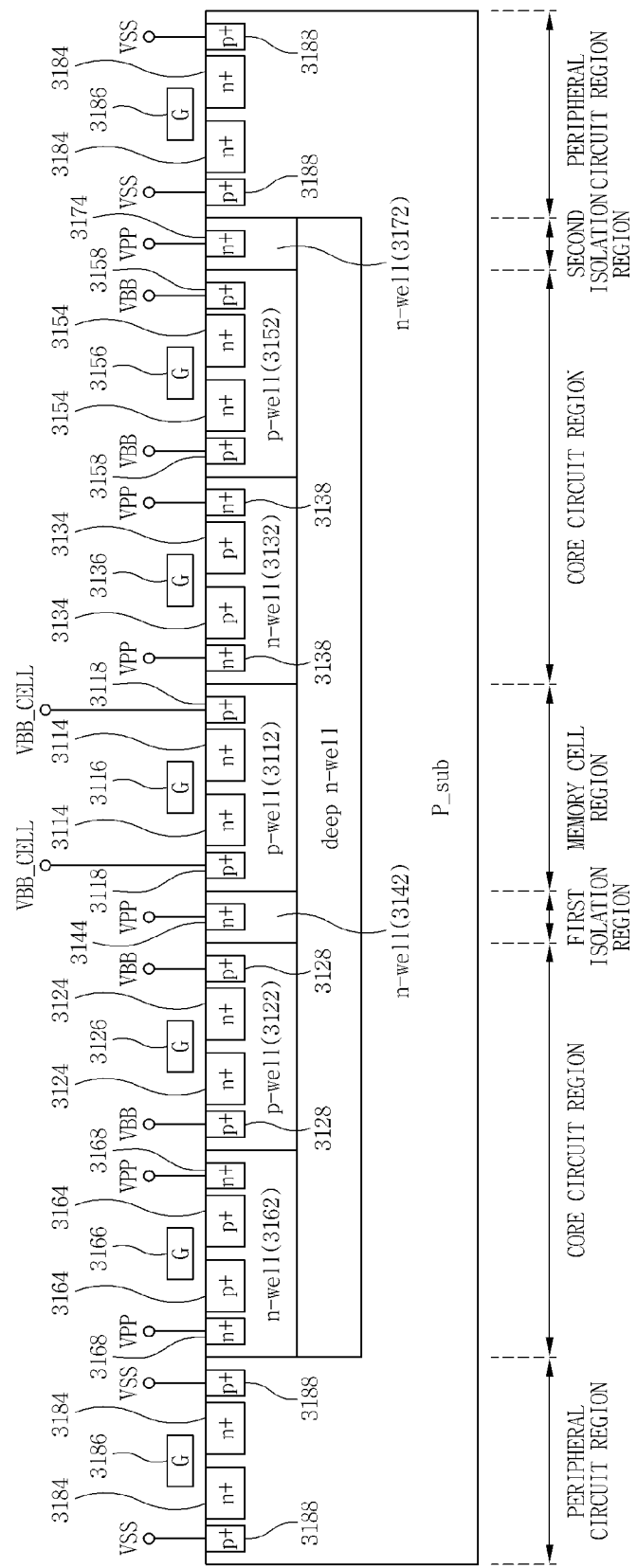
FIG. 31 is an exemplary diagram for explaining a transistor well structure of a magneto-resistive memory device according to one embodiment.

FIG. 31 is an exemplary diagram for explaining a transistor well structure of a magneto-resistive memory device according to one embodiment.

Referring to FIG. 31, the transistor well structure may include a memory cell region, a first isolation region, a second isolation region, core circuit regions, and peripheral circuit regions, which are formed in a P-type substrate P_sub.

The memory cell region, the first isolation region, the second isolation region, and the core circuit regions may be formed on a deep n-well formed in a partial region of the P-type substrate P_sub, while the peripheral circuit regions may be formed in the P-type substrate P_sub.

A memory cell transistor may be formed in the memory cell region, core circuit transistors, such as a sense amplifier transistor and a sub-word line driver transistor, may be formed in each of the core circuit regions, and a peripheral circuit transistor, such as a decoder transistor, may be formed in each of the peripheral circuit regions.

The memory cell transistor may include an NMOS transistor. The memory cell transistor may include a p-well 3112, n+ regions 3114 formed in the p-well 3112 and serving as a source and a drain, a gate 3116, and p+ regions 3118 formed in the p-well 3112 and connected to first bulk voltage terminals VBB_CELL.

Each of the core circuit regions may include an inner core circuit region formed on the side of the memory cell region, and an outer core circuit region formed on the side of the peripheral circuit region.

An inner core transistor may be formed in the inner core circuit region, and an outer core transistor may be formed in the outer core circuit region.

The inner core transistor may include a first-conductivity-type inner core transistor, which is an NMOS transistor, and a second-conductivity-type inner core transistor, which is a PMOS transistor.

The first-conductivity-type inner core transistor may include a p-well 3122, n+ regions 3124 formed in the p-well 3122 and serving as a source and a drain, a gate 3126, and p+ regions 3128 formed in the p-well 3122 and connected to second bulk voltage terminals VBB. The first-conductivity-type inner core transistor may be formed adjacent to one side of the memory cell region.

The second-conductivity-type inner core transistor may include an n-well 3132, p+ regions 3134 formed in the n-well 3132 and serving as a source and a drain, a gate 3136, and n+ regions 3138 formed in the n-well 3132 and connected to third bulk voltage terminals VPP. The second-conductivity-type inner core transistor may be formed adjacent to the other side of the memory cell region.

The first isolation region including an n-well 3142 may be formed between the inner core circuit region including the first-conductivity-type inner core transistor and the memory cell region so that the p-well 3122 of the first-conductivity-type inner core transistor can be electrically isolated from the p-well 3112 of the memory cell transistor.

An n+ region 3144 may be formed in the n-well 3142 of the first isolation region and connected to a third bulk voltage terminal VPP.

The outer core transistor may include a first-conductivity-type outer core transistor, which is an NMOS transistor, and a second-conductivity-type outer core transistor, which is a PMOS transistor.

The first-conductivity-type outer core transistor may be formed between the second-conductivity-type inner core transistor and the peripheral circuit transistor. The first-conductivity-type outer core transistor may include a p-well 3152, n+ regions 3154 formed in the p-well 3152 and serving as a source and a drain, a gate 3156, and p+ regions 3158 formed in the p-well 3152 and connected to second bulk voltage terminals VBB.

The second-conductivity-type outer core transistor may be formed between the first-conductivity-type inner core transistor and the peripheral circuit transistor. The second-conductivity-type outer core transistor may include an n-well 3162, p+ regions 3164 formed in the n-well 3162 and serving as a source and a drain, a gate 3166, and n+ regions 3168 formed in the n-well 3162 and connected to third bulk voltage terminals VPP.

A second isolation region including the n-well 3172 may be formed between the outer core circuit region including the first-conductivity-type outer core transistor and the peripheral circuit region so that the p-well 3152 of the first-conductivity-type outer core transistor can be electrically isolated form the P-type substrate P_sub having the peripheral circuit transistor.

An n+ region 3174 may be formed in the n-well 3172 of the second isolation region and connected to a third bulk voltage terminal VPP.

The peripheral circuit transistor may include n+ regions 3184 formed in the P-type substrate P_sub and serving as a source and a drain, a gate 3186, and p+ regions 3188 formed in the P-type substrate P_sub and connected to fourth bulk voltage terminals VSS.

Figure 32:
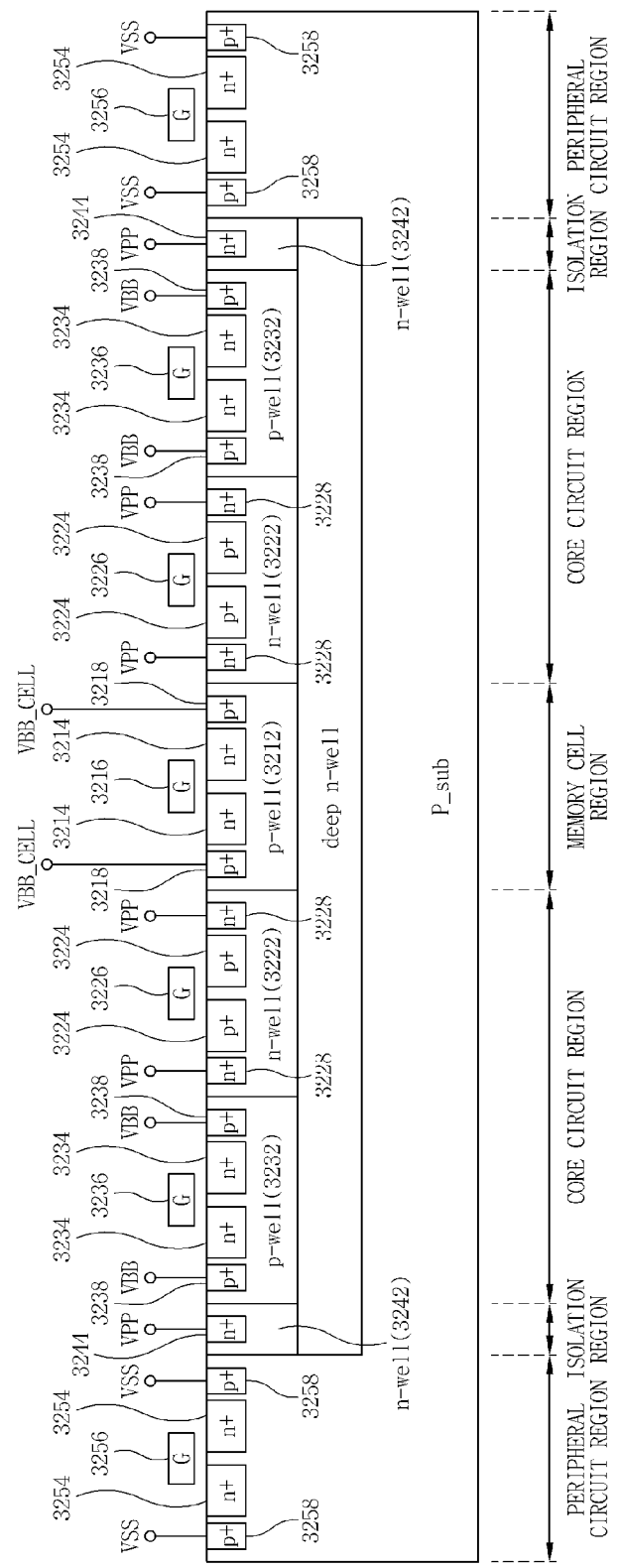
FIG. 32 is an exemplary diagram for explaining a transistor well structure of a magneto-resistive memory device according to one embodiment.

FIG. 32 is an exemplary diagram for explaining a transistor well structure of a magneto-resistive memory device according to one embodiment.

Referring to FIG. 32, the transistor well structure may include a memory cell region, isolation regions, core circuit regions, and peripheral circuit regions, which may be formed in a P-type substrate P_sub.

The memory cell region, the isolation regions, and the core circuit regions may be formed on a deep n-well formed in a partial region of the P-type substrate P_sub, and the peripheral circuit regions may be formed in the P-type substrate P_sub.

A memory cell transistor may be formed in the memory cell region, core circuit transistors, such as sense amplifier transistors and sub-word line driver transistors, may be formed in each of the core circuit regions, and a peripheral circuit transistor, such as a decoder transistor, may be formed in each of the peripheral circuit regions.

The memory cell transistor may be an NMOS transistor. The memory cell transistor may include a p-well 3212, n+ regions 3214 formed in the p-well 3212 and serving as a source and a drain, a gate 3216, and p+ regions 3218 formed in the p-well 3212 and connected to first bulk voltage terminals VBB_CELL.

Each of the core circuit regions may include an inner core circuit region formed on the side of the memory cell region, and an outer core circuit region formed on the side of the corresponding peripheral circuit region.

An inner core transistor may be formed in the inner core circuit region, and an outer core transistor may be formed in the outer core circuit region.

The inner core transistor may be a PMOS transistor and include an n-well 3222, p+ regions 3224 formed in the n-well 3222 and serving as a source and a drain, a gate 3226, and n+ regions 3228 formed in the n-well 3222 and connected to third bulk voltage terminals VPP. Inner core transistors may be respectively formed on both sides of the memory cell region adjacent to the memory cell region.

The outer core transistor may be an NMOS transistor and include a p-well 3232, n+ regions 3234 formed in the p-well 3232 and serving as a source and a drain, a gate 3236, and p+ regions 3238 formed in the p-well 3232 and connected to second bulk voltage terminals VBB.

The isolation region including an n-well 3242 may be formed between each of outer core circuit regions and the corresponding one of the peripheral circuit region so that the p-well 3232 of the outer core transistor can be electrically isolated from the P-type substrate P_sub including the peripheral circuit transistor.

An n+ region 3244 may be formed in the n-well 3242 of each of the isolation regions and connected to a third bulk voltage terminal VPP.

The peripheral circuit transistor may include n+ regions 3254 formed in the P-type substrate P_sub and serving as a source and a drain, a gate 3256, and p+ regions 3258 formed in the P-type substrate P_sub and connected to fourth bulk voltage terminals VSS.

According to the embodiments of the inventive concept, a bulk voltage of a memory cell transistor and a bulk voltage of an inner core transistor may be applied at different levels so that operating characteristics of the memory cell transistor and operating characteristics of the inner core transistor can be separately controlled. As a result, operating characteristics of a memory device may be optimized.

Figure 33:
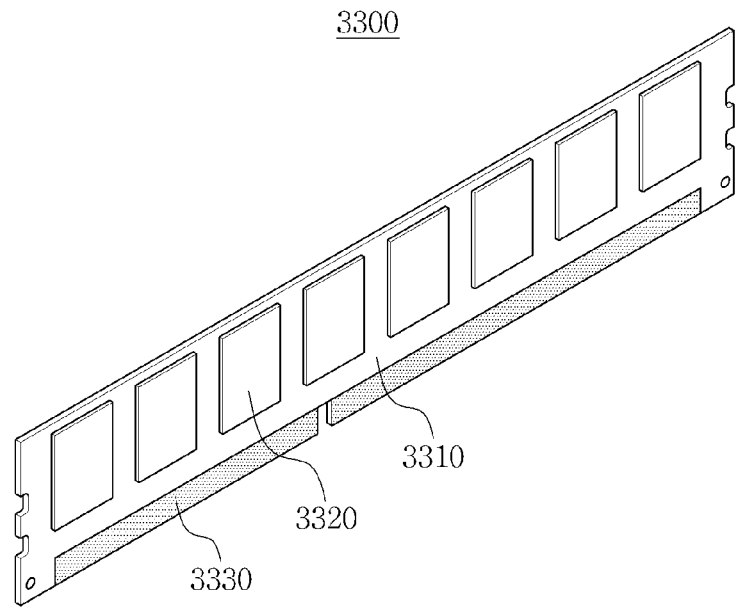
FIG. 33 is an exemplary diagram of a memory module including a magneto-resistive memory device according to some embodiments.

FIG. 33 is an exemplary diagram of a memory module 3300 including a magneto-resistive memory device according to some embodiments.

Referring to FIG. 33, the memory module 3300 may include a printed circuit board (PCB) 3310, a plurality of MRAM memory chips 3320, and a connector 3330. The plurality of MRAM memory chips 3320 may be combined with top and bottom surfaces of the PCB 3310. The connector 3330 may be electrically connected to the plurality of MRAM memory chips 3320 through conductive lines (not shown). Also, the connector 3330 may be connected to a slot of an external host.

Figure 34:
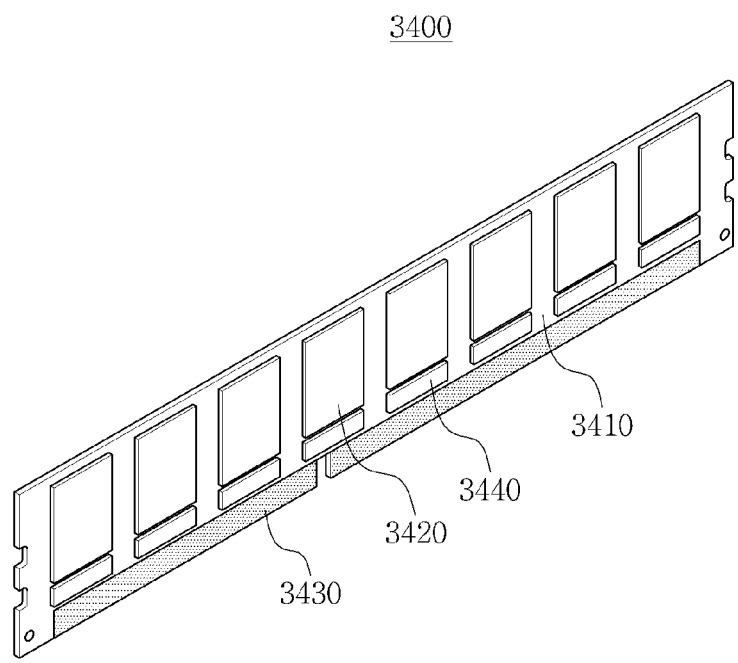
FIG. 34 is an exemplary diagram of a memory module including a magneto-resistive memory device according to some embodiments.

FIG. 34 is an exemplary diagram of a memory module 3400 including a magneto-resistive memory device according to some embodiments.

Referring to FIG. 34, the memory module 3400 may include a PCB 3410, a plurality of MRAM memory chips 3420, a connector 3430, and a plurality of buffers 3440. The plurality of buffers 3440 may be respectively disposed between the MRAM memory chips 3420 and the connector 3430.

The MRAM memory chips 3420 and the buffers 3440 may be disposed on top and bottom surfaces of the PCB 3410. The memory chips 3420 and the buffers 3440 formed on the top and bottom surfaces of the PCB 3410 may be connected through a plurality of via holes.

Figure 35:
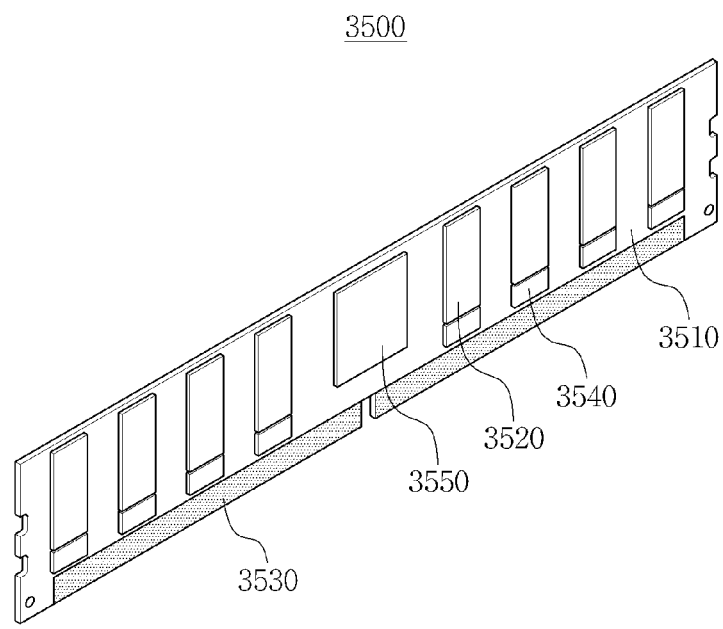
FIG. 35 is an exemplary diagram of a memory module including a magneto-resistive memory device according to some embodiments.

FIG. 35 is an exemplary diagram of a memory module 3500 including a magneto-resistive memory device according to some embodiments.

Referring to FIG. 35, the memory module 3500 may include a PCB 3510, a plurality of MRAM memory chips 3520, a connector 3530, a plurality of buffers 3540, and a controller 3550.

The MRAM memory chips 3520 and the buffers 3540 may be disposed on top and bottom surfaces of the PCB 3510. The MRAM memory chips 3520 and the buffers 3540 formed on the top and bottom surfaces of the PCB 3510 may be connected through a plurality of via holes.

The controller 3550 may control the MRAM memory chips 3520 and read or write data to and from the corresponding one of the MRAM memory chips 3520.

Figure 36:
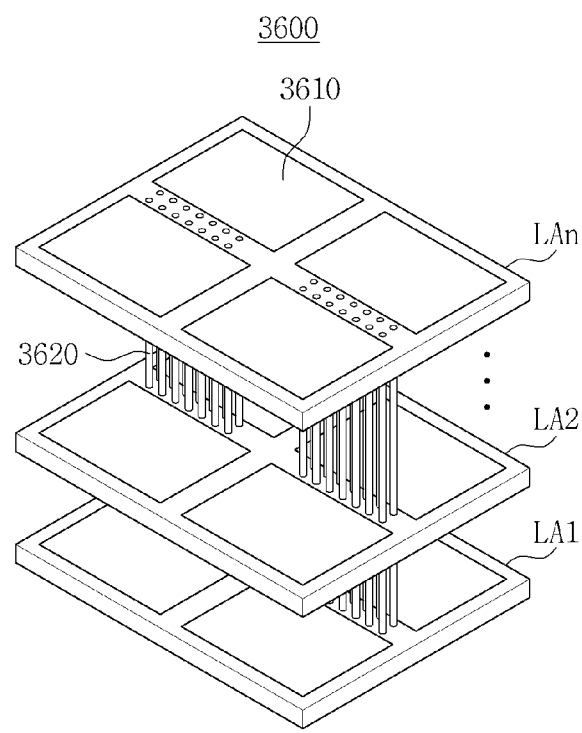
FIG. 36 is an exemplary schematic diagram of a stack-type semiconductor device including a plurality of semiconductor layers according to some embodiments.

FIG. 36 is an exemplary schematic diagram of a stack-type semiconductor device 3600 including a plurality of semiconductor layers according to some embodiments. In the module structures shown in FIGS. 33 through 35, each of the memory chips may include a plurality of semiconductor layers LA1 to LAn.

In the stack-type semiconductor device 3600, the plurality of semiconductor layers LA1 to LAn that are sequentially stacked may be connected to one another by through-substrate vias (e.g., through-silicon vias, TSVs) 3620. Each of the semiconductor layers LA1 to LAn may include memory cell arrays 3610 including STT-MRAM cells.

Figure 37:
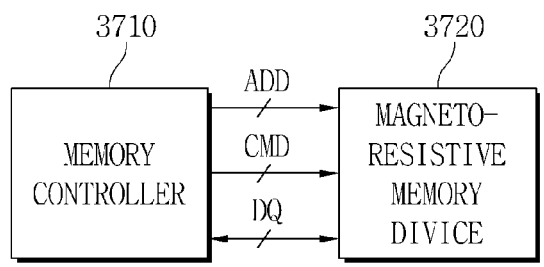
FIG. 37 is a block diagram of an example of a memory system including a magneto-resistive memory device according to some embodiments.

FIG. 37 is a block diagram of an example of a memory system 3700 including a magneto-resistive memory device according to some embodiments.

Referring to FIG. 37, the memory system 3700 may include a memory controller 3710 and a magneto-resistive memory device 3720.

The memory controller 3710 may generate an address signal ADD and a command CMD, and provide the address signal ADD and the command CMD through buses to the magneto-resistive memory device 3720. Data DQ may be transmitted from the memory controller 3710 through the bus to the magneto-resistive memory device 3720 or transmitted from the magneto-resistive memory device 3720 through the bus to the memory controller 3710.

The magneto-resistive memory device 3720 may be a magneto-resistive memory device according to certain embodiments, and may include a source line voltage generator.

Figure 38:
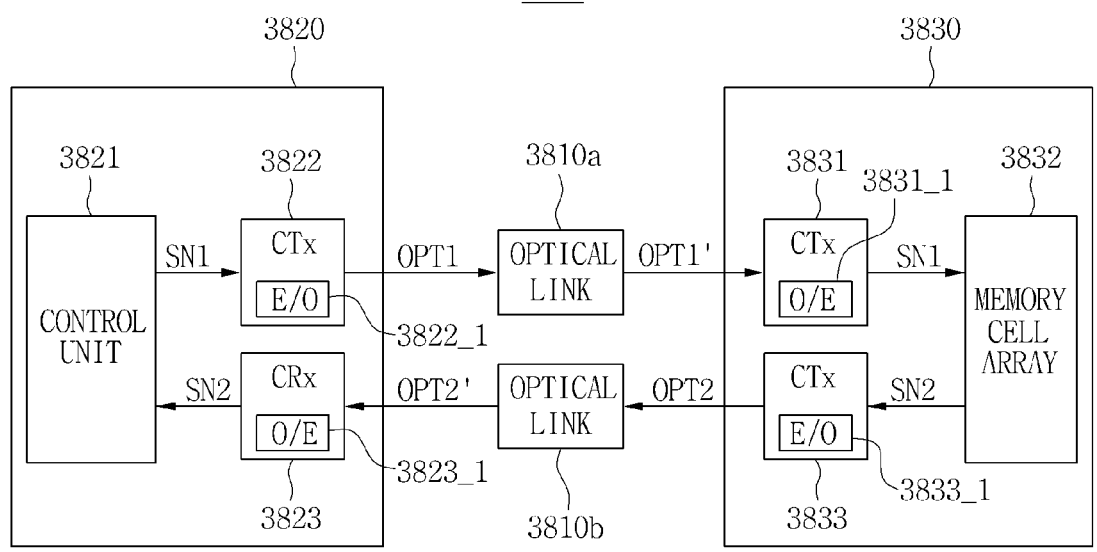
FIG. 38 is a block diagram of an example of a memory system including a magneto-resistive memory device and an optical link according to some embodiments.

FIG. 38 is a block diagram of an example of a memory system 3800 including a magneto-resistive memory device and an optical link according to some embodiments.

Referring to FIG. 38, the memory system 3800 may include a controller 3820, a magneto-resistive memory device 3830, and a plurality of optical lines 3810a and 3810b configured to interconnect the controller 3820 and the magneto-resistive memory device 3830. The controller 3820 may include a control unit 3821, a first transmitter 3822, and a first receiver 3823. The control unit 3821 may transmit a control signal SN1 to the first transmitter 3822.

The first transmitter 3822 may include a first optical modulator 3822_1, which may convert the control signal SN1, which is an electric signal, into a first optical transmission signal OPT1, and transmit the first optical transmission signal OPT1 to the optical link 3810a.

The first receiver 3823 may include a first optical demodulator 3823_1, which may convert a second optical receiving signal OPT2' received from the optical link 3810b into a data signal SN2, which is an electric signal, and transmit the data signal SN2 into the control unit 3821.

The magneto-resistive memory device 3830 may include a second receiver 3831, a memory cell array 3832, and a second transmitter 3833. The second receiver 3831 may include a second optical demodulator 3831_1, which may convert a first optical receiving signal OPT1' output by the optical link 3810a into the control signal SN1, which is an electric signal, and transmit the control signal SN1 to the memory cell array 3832.

Data may be written in the memory cell array 3832 under the control of the control signal SN1, or the data signal SN2 output by the memory cell array 3832 may be transmitted to the second transmitter 3833.

The second transmitter 3833 may include a second optical modulator 3833_1, which may convert the data signal SN2, which is the electric signal, into a second data signal OPT2, and transmit the second optical data signal OPT2 to the optical link 3810b.

Figure 39:
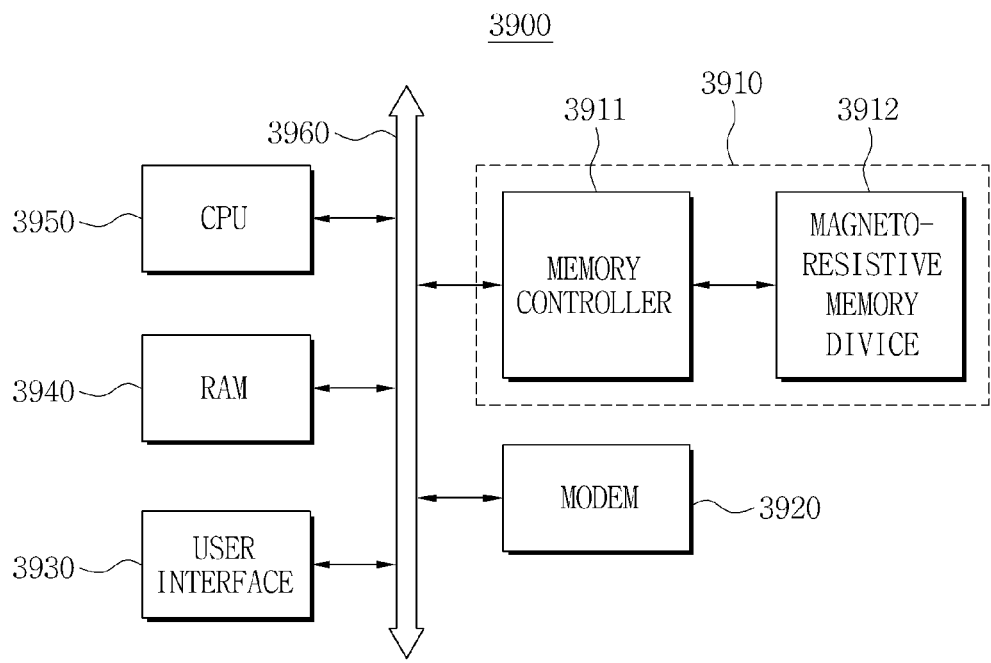
FIG. 39 is a block diagram of an example of an information processing system including a magneto-resistive memory device according to some embodiments.

FIG. 39 is a block diagram of a computer system 3900, which is an example of an information processing system including a magneto-resistive memory device according to some embodiments.

Referring to FIG. 39, a magneto-resistive memory device may be mounted on the computer system 3900, which may be, for example, a mobile device or a desktop computer. The computer system 3900 may include a magneto-resistive memory system 3910, a modem 3920, a central processing unit (CPU) 3950, a RAM 3940, and a user interface 3930, which may be electrically connected to a system bus 3960.

The magneto-resistive memory system 3910 may include a memory controller 3911 and a magneto-resistive memory device 3912. Data processed by the CPU 3950 or externally input data may be stored in the magneto-resistive memory device 3912.

A semiconductor memory device including magneto-resistive memory cells may be applied to at least one of the magneto-resistive memory device 3912 or the RAM 3940. That is, a semiconductor memory device including STT-MRAM cells may be applied to the magneto-resistive memory device 3912 configured to store a large amount of data required for the computer system 3900 or the RAM 3940 configured to store data (e.g., system data) to be rapidly accessed. Although not shown in FIG. 39, an application chipset, a camera image processor (CIP), and an I/O device may be further provided in the computer system 3900.

Figure 40:
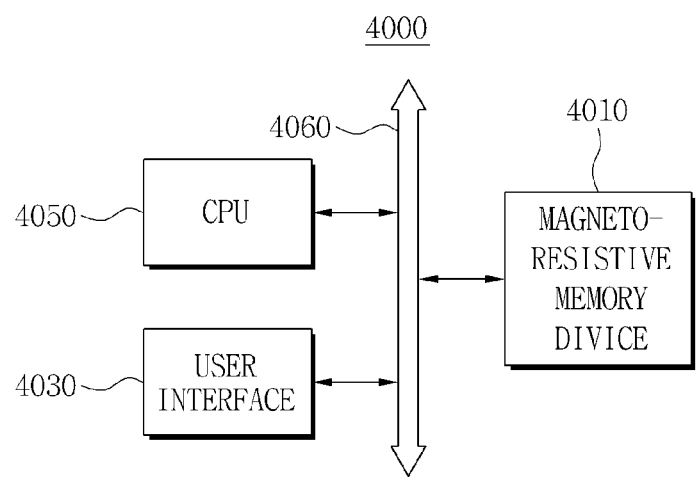
FIG. 40 is a block diagram of an example of an information processing system including a magneto-resistive memory device according to some embodiments.

FIG. 40 is a block diagram of a computer system 4000, which is an example of an information processing system including a magneto-resistive memory device according to some embodiments.

Referring to FIG. 40, a magneto-resistive memory device 4010 including STT-MRAM cells may be mounted on the computer system 4000, which may be, for example, a mobile device or a desktop computer. The computer system 4000 may include a magneto-resistive memory device 4010, a CPU 4050, and a user interface 4030, which may be electrically connected to a system bus 4060.

The magneto-resistive memory device 4010 may be an advanced memory that may satisfy not only low-cost and high-capacity characteristics of DRAMs and operating speeds of SRAMs, but also non-volatile characteristics of flash memories. Accordingly, as compared with a conventional system in which a cache memory and a RAM having high processing speeds and a storage configured to store a large amount of data are separately provided, a magneto-resistive memory device according to certain embodiments may replace all the above-described memories. Since a system including the magneto-resistive memory device can store a large amount of data at high speed, a computer system can be structurally simplified.

The present disclosure can be applied to semiconductor devices, and particularly to, magneto-resistive memory devices and memory systems including the same.

According to the embodiments disclosed herein, an architecture capable of optimizing operating characteristics of a magneto-resistive memory device and increasing the integration density of elements constituting the magneto-resistive memory device can be provided.

Furthermore, according to the embodiments, a layout area of a magneto-resistive memory device can be reduced.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this disclosure as defined in the claims. In the claims, means-plus-function clauses are intended to cover the structures described herein as performing the recited function, and not only structural equivalents but also equivalent structures.

What is claimed is:

1. A semiconductor memory device comprising:
 a row decoder configured to decode row addresses and drive global word line driving signals on global word lines;
 a column decoder configured to decode column addresses and drive column selection signals on column selection lines;
 a plurality of sub-cell blocks, each sub-cell block including a plurality of bit lines, a plurality of word lines, and a plurality of memory cells connected to the plurality of bit lines and the plurality of word lines;
 a plurality of bit line sense amplifier regions, each bit line sense amplifier region including bit line sense amplifiers and disposed between two sub-cell blocks in a first direction, wherein each of the bit line sense amplifiers is configured to sense and amplify data of a corresponding bit line;
 a plurality of sub-word line drivers, each sub-word line driver disposed between two sub-cell blocks in a second direction perpendicular to the first direction and configured to drive corresponding word lines in response to the global word line driving signals; and
 a bit line selection circuit including a plurality of bit line connection controllers, and configured to select one or more bit lines in response to the column selection signals,
 wherein each of the bit line connection controllers electrically couples a respective first bit line to corresponding first and second local input/output (I/O) lines in response to first and second column selection signals of the column selection signals, respectively.

2. The device of claim 1, wherein a first sub-word line driver of the sub-word line drivers is disposed at a first side of a first sub-cell block, and is configured to drive odd word lines of the first sub-cell block, and
 wherein a second sub-word line driver of the sub-word line drivers is disposed at a second side of the first sub-cell block opposite to the first side, and is configured to drive even word lines of the first sub-cell block.

3. The device of claim 2, wherein a first global word line of the global word lines is disposed over the first sub-cell block, extended in the second direction, and connected to the first and second sub-word line drivers.

4. The device of claim 3, wherein, the second sub-word line driver is configured to drive M word lines, M is equal to $2^x$, and x is an integer equal to or greater than 0.

5. The device of claim 1, wherein a first set of the bit line connection controllers connected to a first set of the bit lines is disposed at a first side of a first sub-cell block of the sub-cell blocks,
 wherein a second set of the bit line connection controllers connected to a second set of the bit lines is disposed at a second side of the first sub-cell block opposite to the first side, and
 wherein the first set of the bit lines is odd bit lines and the second set of the bit lines is even bit lines.

6. The device of claim 5, wherein the first set of the bit line connection controllers includes a plurality of first sets of column selection line transistors, each first set of column selection line transistors electrically coupling a respective bit line of the first set of the bit lines to corresponding first and second local input/output (I/O) lines in response to the first and second column selection signals, respectively,
 wherein the second set of the bit line connection controllers includes a plurality of second sets of column selection line transistors, each second set of column selection line transistors electrically coupling a respective bit line of the second set of bit lines to corresponding first and second local input/output (I/O) lines in response to the first and second column selection signals, respectively,
 wherein each of the first and second sets of column selection line transistors is disposed in $2^M$ lines and in the second direction, and
 wherein M is an integer equal to or greater than 0.

7. The device of claim 6, wherein each of the first set of column selection line transistors includes:
 a first transistor having a first conductivity-type, the first transistor electrically coupling a first bit line of the first set of bit lines to a first local input/output (I/O) line in response to the first column selection signal; and
 a second transistor having the first conductivity-type, the second transistor electrically coupling the first bit line to a second local input/output (I/O) line in response to the second column selection signal.

8. The device of claim 6, wherein each of the first set of column selection line transistors includes:
 a first transistor having a first conductivity-type, the first transistor electrically coupling a first bit line of the first set of bit lines to a first local input/output (I/O) line in response to the first column selection signal;

a second transistor having a second conductivity-type different from the first conductivity-type, the second transistor electrically coupling the first bit line to the first local input/output (I/O) line in response to a complementary signal of the first column selection signal;

a third transistor having the first conductivity-type, the third transistor electrically coupling the first bit line to a second local input/output (I/O) line in response to the second column selection signal; and a fourth transistor having the second conductivity-type, the fourth transistor electrically coupling the first bit line to the second local input/output (I/O) line in response to a complementary signal of the second column selection signal.

9. The device of claim 6, wherein each of the first sets of column selection line transistors includes:

a first transistor having a first conductivity-type, the first transistor electrically coupling a first bit line of the first set of bit lines to a first local input/output (I/O) line in response to the first column selection signal;

a first inverter having an input terminal configured to receive the first column selection signal, and an output terminal configured to drive an output signal;

a second transistor having a second conductivity-type different from the first conductivity-type, the second transistor electrically coupling the first bit line to the first local input/output (I/O) line in response to the output signal of the first inverter;

a third transistor having the first conductivity-type, the third transistor electrically coupling the first bit line to a second local input/output (I/O) line in response to the second column selection signal;

a second inverter having an input terminal configured to receive the second column selection signal, and an output terminal configured to drive an output signal;

a fourth transistor having the second conductivity-type, the fourth transistor electrically coupling the first bit line to the second local input/output (I/O) line in response to the output signal of the second inverter.

10. The device of claim 1, wherein each bit line sense amplifier region comprises:

at least a first P region including a plurality of PMOS transistors disposed in the first direction; and at least a first N region including a plurality of NMOS transistors disposed in the first direction and spaced apart from the first P region in the second direction.

11. The device of claim 10, wherein each bit line sense amplifier region further comprises:

at least a second P region including a plurality of PMOS transistors disposed in the second direction; and at least a second N region including a plurality of NMOS transistors disposed in the second direction and spaced apart from the second P region in the first direction.

12. The device of claim 1, wherein the each bit line sense amplifier region comprises:

a plurality of P regions and a plurality of N regions alternately disposed in the second direction, wherein each of the P regions includes a plurality of PMOS transistors disposed in the first direction, and wherein each of the N regions includes a plurality of NMOS transistors disposed in the first direction.

13. The device of claim 1, further comprising:

a memory cell region including the plurality of memory cells formed in a first well; and first and second core circuit regions formed adjacent to a first side and second side of the memory cell region opposite to the first side, respectively, each of the first and second core circuit regions including an inner core circuit transistor formed in a respective second well and adjacent to the first side or second side of the memory cell region, and an outer core circuit transistor formed in a third well and adjacent to the inner core circuit transistor, wherein the first well of the memory cells is isolated from the second well of the inner core circuit transistor in the first and second core circuit regions.

14. The device of claim 13, further comprising:

a fourth well having a first-type well formed between the first well and the second well in the first core circuit region; and a fifth well having the first-type well formed between the first well and the second well in the second core circuit region, wherein each of the first well and the second well of each of the first and second core circuit regions is a second-type well different from the first-type well, and wherein the third well of each of the first and second core circuit regions is the first-type well.

15. The device of claim 14, wherein the first-type well is an n-well, and the second-type well is a p-well, wherein a p+ region formed in the first well is connected to a first voltage terminal, wherein a p+ region formed in the second well is connected to a second voltage terminal different from the first voltage terminal, and wherein an n+ region formed in the third well is connected to a third voltage terminal, and a voltage level of the third voltage terminal is different from those of the first and second voltage terminals.

16. The device of claim 13, wherein the first well is a first-type well, wherein the second well of a first inner core circuit transistor formed in the first core circuit region is the first-type well, and the second well of a second inner core circuit transistor formed in the second core circuit region is a second-type well different from the first-type well, wherein the third well of a first outer core circuit transistor formed in the first core circuit region is the second-type well, and the third well of a second outer core circuit transistor formed in the second core circuit region is the first-type well, wherein a fourth well having the second-type well is formed between the first well and the second well of the first inner core circuit transistor, and wherein a fifth well having the second-type well is formed between the third well of the second outer core circuit transistor and a peripheral circuit region.

17. The device of claim 16, wherein the first-type wells is a p-well, and the second-type wells is an n-well, wherein a p+ region formed in the first well is connected to a first voltage terminal, wherein a p+ region formed in each of the second well of the first inner core circuit transistor and the third well of the second outer core circuit transistor is connected to a second voltage terminal different from the first voltage terminal, and wherein an n+ region formed in each of the third well of the first outer core circuit transistor and the second well of the second inner core circuit transistor is connected to a third voltage terminal, and a voltage level of the third voltage terminal is different from those of the first and second voltage terminals.

18. The device of claim 13, further comprising:
a fourth well having a first-type well is formed between the third well of the outer core circuit transistor in the first core circuit region and a first peripheral circuit region; and
a fifth well having the first-type cell is formed between the third well of the outer core circuit transistor in the second core circuit region and a second peripheral circuit region,
wherein the first well is a second-type well different from the first-type well,
wherein the second well of the inner core circuit transistor of each of the first and second core circuit regions is the first-type well,
wherein the third well of the outer core circuit transistor of each of the first and second core circuit regions is the second-type well.

19. The device of claim 18, wherein each of the first-type wells is an n-well, and each of the second-type wells is a p-well,
wherein a p+ region formed in the first well is connected to a first voltage terminal,
wherein a p+ region formed in the third well of the outer core circuit transistor of each of the first and second core circuit regions is connected to a second voltage terminal different from the first voltage terminal, and
wherein an n+ region is formed in the second well of the inner core circuit transistor of each of the first and second core circuit regions is connected to a third voltage terminal, and a voltage level of the third voltage terminal is different from those of the first and second voltage terminals.

20. The device of claim 1, wherein each of the plurality of memory cells comprises:
a memory cell transistor having a gate connected to a corresponding word line and a source connected to a source line; and
a magnetic tunnel junction (MTJ) element including a pinned layer connected to a drain of the memory cell transistor, a tunnel barrier layer stacked on the pinned layer, and a free layer stacked on the tunnel barrier layer and connected to a corresponding bit line.

21. A semiconductor memory device comprising:
a plurality of cell blocks, each cell block including a plurality of memory cells connected to a plurality of bit lines extending in a first direction and a plurality of word lines extending in a second direction perpendicular to the first direction;
a row decoder configured to decode row addresses and drive word line driving signals on the word lines;
a column decoder configured to decode column addresses and drive column selection signals on column selection lines; and
a plurality of bit line sense amplifier regions, each bit line sense amplifier region including bit line sense amplifiers disposed between the cell blocks in the first direction,
wherein a first bit line sense amplifier region of the bit line sense amplifier regions includes:
a first P region including a plurality of PMOS transistors disposed in the first direction; and
a first N region including a plurality of NMOS transistors disposed in the first direction and spaced apart from the first P region in the second direction.

22. The semiconductor memory device of claim 21, wherein each bit line sense amplifier region further includes:
a second P region including a plurality of PMOS transistors disposed in the second direction; and
a second N region including a plurality of NMOS transistors disposed in the second direction and spaced apart from the second P region in the first direction.

23. The semiconductor memory device of claim 21, further comprising:
a first well including the plurality of memory cells, a first well bias region, a first side, and a second side opposite to the first side; and
second and third wells including second and third well bias regions and disposed adjacent to the first and second sides of the first well, respectively,
wherein the first well bias region is connected to a first voltage terminal,
wherein the second and third well bias regions are connected to second and third voltage terminal, and
wherein a voltage level of the first voltage terminal is different from voltage levels of the second and third voltage terminals.

24. The semiconductor memory device of claim 23, wherein the first well is a first-type well and each of the second and third wells is a second-type well different from the first-type well.

25. The semiconductor memory device of claim 24, wherein each of the second and third wells does not include any transistors.

26. The semiconductor memory device of claim 24, wherein the second well does not include any transistors and the third well includes at least one transistor.

27. The semiconductor memory device of claim 24, wherein each of the second and third wells includes at least one transistor.

28. A semiconductor memory device comprising:
a memory cell region including a plurality of memory cells connected to a plurality of word lines and a plurality of bit lines, wherein the memory cells are formed in a first well that is a first-type well;
a row decoder configured to decode row addresses and output global word line driving signals, and is disposed in a peripheral circuit region;
a column decoder configured to decode column addresses and output column selection signals, and is disposed in the peripheral circuit region;
a sub-word line driver configured to output respective word line driving signals in response to the global word line driving signals, and is disposed in a core circuit region;
a bit line sense amplifier including a plurality of PMOS and NMOS transistors, and is disposed in the core circuit region;
a second well that is a second-type well different from the first-type well, and is disposed adjacent to a first side of the first well; and
a third well that is the second-type well, and is disposed adjacent to a second side of the first well opposite to the first side,
wherein the first well includes a first well bias region connected to a first voltage terminal,
wherein each of the second and third wells includes second and third bias regions connected to second and third voltage terminals, respectively,
wherein the first voltage terminal is configured to receive a first voltage level different from that received by each of the second and third voltage terminals, and wherein the first through third wells are disposed on a fourth well that is the second-type well.

29. The semiconductor memory device of claim 28, wherein a first core circuit region of the core circuit region is disposed adjacent to the second well, the first core circuit region includes a first inner core circuit transistor disposed in a fifth well disposed adjacent to the second well and a first outer core circuit transistor disposed in a sixth well disposed adjacent to the fifth well, wherein a second core circuit region of the core circuit region is disposed adjacent to the third well, the second core circuit region includes a second inner core circuit transistor disposed in a seventh well disposed adjacent to the third well and a second outer core circuit transistor disposed in a eighth well disposed adjacent to the seventh well, and wherein each of the fifth and seventh wells is the first-type well and each of the sixth and eighth wells is the second-type well.

30. The semiconductor memory device of claim 28, wherein a first core circuit region of the core circuit region is disposed adjacent to the second well, the first core circuit region includes a first inner core circuit transistor disposed in a fifth well disposed adjacent to the second well and a first outer core circuit transistor disposed in a sixth well disposed adjacent to the fifth well, wherein a second core circuit region of the core circuit region is disposed adjacent to the first well, the second core circuit region includes a second inner core circuit transistor disposed in the third well and a second outer core circuit transistor disposed in a seventh well disposed adjacent to the third well, and wherein each of the fifth and seventh wells is the first-type well and the sixth well is the second-type well.

31. The semiconductor memory device of claim 28, wherein a first core circuit region of the core circuit region is disposed adjacent to the first side of the first well, the first core circuit region includes a first inner core circuit transistor disposed in the second well and a first outer core circuit transistor disposed in a fifth well disposed adjacent to the second well, wherein a second core circuit region of the core circuit region is disposed adjacent to the second side of the first well, the second core circuit region includes a second inner core circuit transistor disposed in the third well and a second outer core circuit transistor disposed in a sixth well disposed adjacent to the third well, and wherein each of the fifth and sixth wells is the first-type well.

* * * * *